(12) United States Patent
Wober

(10) Patent No.: US 8,514,411 B2
(45) Date of Patent: *Aug. 20, 2013

(54) DETERMINATION OF OPTIMAL DIAMETERS FOR NANOWIRES

(71) Applicant: Munib Wober, Topsfield, MA (US)

(72) Inventor: Munib Wober, Topsfield, MA (US)

(73) Assignee: Zena Technologies, Inc., Cambridge, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/621,607

(22) Filed: Sep. 17, 2012

(65) Prior Publication Data

US 2013/0016258 A1    Jan. 17, 2013

Related U.S. Application Data

(63) Continuation of application No. 12/472,264, filed on May 26, 2009, now Pat. No. 8,269,985.

(51) Int. Cl.
*G01B 11/14* (2006.01)

(52) U.S. Cl.
USPC ... 356/625; 356/12; 250/227.23; 250/227.11; 250/227.2; 348/488

(58) Field of Classification Search
USPC ............ 356/625; 250/227.11, 227.2, 227.23; 385/12
See application file for complete search history.

(56) References Cited

U.S. PATENT DOCUMENTS

| | | | |
|---|---|---|---|
| 1,918,848 A | 7/1933 | Land | |
| 3,903,427 A | 9/1975 | Pack | |
| 4,017,332 A | 4/1977 | James | |
| 4,387,265 A | 6/1983 | Dalal | |
| 4,400,221 A | 8/1983 | Rahilly | |
| 4,443,890 A | 4/1984 | Eumurian | |
| 4,513,168 A | 4/1985 | Borden | |
| 4,827,335 A | 5/1989 | Saito | |
| 4,880,613 A | 11/1989 | Satoh | |
| 4,896,941 A | 1/1990 | Hayashi | |
| 4,950,625 A | 8/1990 | Nakashima | |
| 4,971,928 A | 11/1990 | Fuller | |
| 4,972,244 A | 11/1990 | Buffet | |
| 5,096,520 A | 3/1992 | Faris | |

(Continued)

FOREIGN PATENT DOCUMENTS

| JP | 02151715 | 5/2002 |
|---|---|---|
| JP | 2005252210 | 9/2005 |

(Continued)

OTHER PUBLICATIONS

U.S. Office Action for U.S. Appl. No. 13/494,661, notification date Nov. 7, 2012.

(Continued)

*Primary Examiner* — Tarifur Chowdhury
*Assistant Examiner* — Isiaka Akanbi
(74) *Attorney, Agent, or Firm* — Pillsbury Winthrop Shaw Pittman LLP

(57) ABSTRACT

Methods of optimizing the diameters of nanowire photodiode light sensors. The method includes comparing the response of nanowire photodiode pixels having predetermined diameters with standard spectral response curves and determining the difference between the spectral response of the photodiode pixels and the standard spectral response curves. Also included are nanowire photodiode light sensors with optimized nanowire diameters and methods of scene reconstruction.

29 Claims, 6 Drawing Sheets

(56) References Cited

U.S. PATENT DOCUMENTS

| | | | |
|---|---|---|---|
| 5,124,543 | A | 6/1992 | Kawashima |
| 5,272,518 | A | 12/1993 | Vincent |
| 5,311,047 | A | 5/1994 | Chang |
| 5,347,147 | A | 9/1994 | Jones |
| 5,362,972 | A | 11/1994 | Yazawa |
| 5,401,968 | A | 3/1995 | Cox |
| 5,449,626 | A | 9/1995 | Hezel |
| 5,468,652 | A | 11/1995 | Gee |
| 5,602,661 | A | 2/1997 | Schadt |
| 5,612,780 | A | 3/1997 | Rickenbach |
| 5,696,863 | A | 12/1997 | Kleinerman |
| 5,723,945 | A | 3/1998 | Schermerhorn |
| 5,747,796 | A | 5/1998 | Heard |
| 5,767,507 | A | 6/1998 | Unul |
| 5,798,535 | A | 8/1998 | Huang |
| 5,853,446 | A | 12/1998 | Carre |
| 5,877,492 | A | 3/1999 | Fujieda |
| 5,880,495 | A | 3/1999 | Chen |
| 5,900,623 | A | 5/1999 | Tsang |
| 5,943,463 | A | 8/1999 | Unuma |
| 6,033,582 | A | 3/2000 | Lee |
| 6,037,243 | A | 3/2000 | Ha |
| 6,046,466 | A | 4/2000 | Ishida |
| 6,074,892 | A | 6/2000 | Bowers |
| 6,100,551 | A | 8/2000 | Lee |
| 6,270,548 | B1 | 8/2001 | Campbell |
| 6,326,649 | B1 | 12/2001 | Chang |
| 6,388,243 | B1 | 5/2002 | Berezin |
| 6,388,648 | B1 | 5/2002 | Clifton |
| 6,459,034 | B2 | 10/2002 | Muramoto |
| 6,542,231 | B1 | 4/2003 | Garrett |
| 6,566,723 | B1 | 5/2003 | Vook |
| 6,680,216 | B2 | 1/2004 | Kwasnick |
| 6,709,929 | B2 | 3/2004 | Zhang |
| 6,720,594 | B2 | 4/2004 | Rahn |
| 6,771,314 | B1 | 8/2004 | Bawolek |
| 6,805,139 | B1 | 10/2004 | Savas |
| 6,812,473 | B1 | 11/2004 | Amemiya |
| 6,927,145 | B1 | 8/2005 | Yang |
| 6,960,526 | B1 | 11/2005 | Shah |
| 6,967,120 | B2 | 11/2005 | Jang |
| 6,969,899 | B2 | 11/2005 | Yaung |
| 6,987,258 | B2 | 1/2006 | Mates |
| 6,996,147 | B2 | 2/2006 | Majumdar |
| 7,052,927 | B1 | 5/2006 | Fletcher |
| 7,105,428 | B2 | 9/2006 | Pan |
| 7,109,517 | B2 | 9/2006 | Zaidi |
| 7,153,720 | B2 | 12/2006 | Augusto |
| 7,163,659 | B2 | 1/2007 | Stasiak |
| 7,230,286 | B2 | 6/2007 | Cohen |
| 7,235,475 | B2 | 6/2007 | Kamins |
| 7,241,434 | B2 | 7/2007 | Anthony |
| 7,254,151 | B2 * | 8/2007 | Lieber et al. ............... 372/44.01 |
| 7,262,400 | B2 | 8/2007 | Yaung |
| 7,265,328 | B2 | 9/2007 | Mouli |
| 7,285,812 | B2 | 10/2007 | Tang |
| 7,306,963 | B2 | 12/2007 | Linden |
| 7,307,327 | B2 | 12/2007 | Bahl |
| 7,311,889 | B2 | 12/2007 | Awano |
| 7,330,404 | B2 | 2/2008 | Peng |
| 7,335,962 | B2 | 2/2008 | Mouli |
| 7,336,860 | B2 | 2/2008 | Cyr |
| 7,358,583 | B2 | 4/2008 | Reznik |
| 7,446,025 | B2 | 11/2008 | Cohen |
| 7,462,774 | B2 | 12/2008 | Roscheisen |
| 7,471,428 | B2 | 12/2008 | Ohara |
| 7,491,269 | B2 | 2/2009 | Legagneux |
| 7,521,322 | B2 | 4/2009 | Tang |
| 7,598,482 | B1 * | 10/2009 | Verhulst et al. ............ 250/214.1 |
| 7,622,367 | B1 | 11/2009 | Nuzzo |
| 7,646,138 | B2 | 1/2010 | Williams |
| 7,646,943 | B1 | 1/2010 | Wober |
| 7,647,695 | B2 * | 1/2010 | MacNutt et al. ............... 29/837 |
| 7,655,860 | B2 | 2/2010 | Parsons |
| 7,663,202 | B2 | 2/2010 | Wang |
| 7,704,806 | B2 | 4/2010 | Chae |
| 7,713,779 | B2 | 5/2010 | Firon |
| 7,719,688 | B2 | 5/2010 | Kamins |
| 7,732,839 | B2 | 6/2010 | Sebe |
| 7,736,954 | B2 | 6/2010 | Hussain |
| 7,740,824 | B2 | 6/2010 | Godfried |
| 7,790,495 | B2 | 9/2010 | Assefa |
| 7,888,155 | B2 | 2/2011 | Chen |
| 8,035,184 | B1 | 10/2011 | Dutta |
| 8,063,450 | B2 | 11/2011 | Wernersson |
| 8,093,675 | B2 | 1/2012 | Tsunemi |
| 8,118,170 | B2 | 2/2012 | Sato |
| 8,242,353 | B2 | 8/2012 | Karg |
| 8,299,472 | B2 | 10/2012 | Yu et al. |
| 8,330,090 | B2 | 12/2012 | Agarwal |
| 8,384,007 | B2 | 2/2013 | Yu et al. |
| 2002/0020846 | A1 | 2/2002 | Pi |
| 2002/0104821 | A1 | 8/2002 | Bazylenkob |
| 2002/0109082 | A1 | 8/2002 | Nakayama |
| 2002/0172820 | A1 | 11/2002 | Majumdar |
| 2003/0003300 | A1 | 1/2003 | Korgel |
| 2003/0006363 | A1 | 1/2003 | Campbell |
| 2003/0077907 | A1 | 4/2003 | Kao |
| 2003/0089899 | A1 | 5/2003 | Lieber |
| 2003/0103744 | A1 | 6/2003 | Koyama |
| 2003/0132480 | A1 | 7/2003 | Chau |
| 2003/0189202 | A1 | 10/2003 | Li |
| 2003/0227090 | A1 | 12/2003 | Okabe |
| 2004/0026684 | A1 | 2/2004 | Empedocles |
| 2004/0058058 | A1 | 3/2004 | Shchegolikhin et al. |
| 2004/0065362 | A1 | 4/2004 | Watabe |
| 2004/0075464 | A1 | 4/2004 | Samuelson |
| 2004/0118337 | A1 | 6/2004 | Mizutani |
| 2004/0118377 | A1 | 6/2004 | Bloms |
| 2004/0122328 | A1 | 6/2004 | Wang |
| 2004/0124366 | A1 | 7/2004 | Zeng |
| 2004/0155247 | A1 | 8/2004 | Benthien |
| 2004/0180461 | A1 | 9/2004 | Yaung |
| 2004/0213307 | A1 * | 10/2004 | Lieber et al. ............... 372/39 |
| 2004/0223681 | A1 | 11/2004 | Block |
| 2004/0241965 | A1 | 12/2004 | Merritt |
| 2005/0082676 | A1 | 4/2005 | Andry |
| 2005/0095699 | A1 | 5/2005 | Miyauchi |
| 2005/0116271 | A1 | 6/2005 | Kato |
| 2005/0133476 | A1 | 6/2005 | Islam |
| 2005/0190453 | A1 | 9/2005 | Dobashi |
| 2005/0201704 | A1 | 9/2005 | Ellwood |
| 2005/0218468 | A1 | 10/2005 | Owen |
| 2005/0284517 | A1 | 12/2005 | Shinohara |
| 2006/0038990 | A1 | 2/2006 | Habib et al. |
| 2006/0113622 | A1 | 6/2006 | Adkisson |
| 2006/0121371 | A1 | 6/2006 | Wu |
| 2006/0146323 | A1 | 7/2006 | Bratkovski |
| 2006/0260674 | A1 | 11/2006 | Tran |
| 2006/0273262 | A1 | 12/2006 | Sayag |
| 2006/0273389 | A1 | 12/2006 | Cohen |
| 2006/0284118 | A1 | 12/2006 | Asmussen |
| 2007/0012980 | A1 | 1/2007 | Duan et al. |
| 2007/0012985 | A1 | 1/2007 | Stumbo |
| 2007/0023799 | A1 | 2/2007 | Boettiger |
| 2007/0025504 | A1 | 2/2007 | Tumer |
| 2007/0029545 | A1 | 2/2007 | Striakhilev |
| 2007/0052050 | A1 | 3/2007 | Dierickx |
| 2007/0082255 | A1 | 4/2007 | Sun |
| 2007/0099292 | A1 | 5/2007 | Miller |
| 2007/0104441 | A1 | 5/2007 | Ahn |
| 2007/0108371 | A1 | 5/2007 | Stevens |
| 2007/0114622 | A1 | 5/2007 | Adkisson |
| 2007/0120254 | A1 | 5/2007 | Hurkx et al. |
| 2007/0126037 | A1 | 6/2007 | Ikeda |
| 2007/0137697 | A1 | 6/2007 | Kempa |
| 2007/0138376 | A1 | 6/2007 | Naughton |
| 2007/0138380 | A1 | 6/2007 | Adkisson |
| 2007/0138459 | A1 | 6/2007 | Wong |
| 2007/0140638 | A1 | 6/2007 | Yang |
| 2007/0145512 | A1 | 6/2007 | Rhodes |
| 2007/0148599 | A1 | 6/2007 | True |
| 2007/0152248 | A1 | 7/2007 | Choi |
| 2007/0155025 | A1 | 7/2007 | Zhang |

| | | |
|---|---|---|
| 2007/0170418 A1 | 7/2007 | Bowers |
| 2007/0172623 A1 | 7/2007 | Kresse |
| 2007/0187787 A1 | 8/2007 | Ackerson |
| 2007/0196239 A1* | 8/2007 | Vink et al. .................. 422/82.05 |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya |
| 2007/0238265 A1 | 10/2007 | Kurashina |
| 2007/0238285 A1 | 10/2007 | Borden |
| 2007/0246689 A1 | 10/2007 | Ge |
| 2007/0248958 A1 | 10/2007 | Jovanovich |
| 2007/0272828 A1 | 11/2007 | Xu |
| 2007/0285378 A1 | 12/2007 | Lankhorst |
| 2007/0290193 A1 | 12/2007 | Tucker |
| 2008/0001498 A1 | 1/2008 | Muller |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar |
| 2008/0055451 A1 | 3/2008 | Kanbe |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0145965 A1 | 6/2008 | Reznik |
| 2008/0149914 A1 | 6/2008 | Samuelson et al. |
| 2008/0149944 A1 | 6/2008 | Samuelson |
| 2008/0166883 A1 | 7/2008 | Liu |
| 2008/0169017 A1 | 7/2008 | Korevaar |
| 2008/0173615 A1 | 7/2008 | Kim |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwar |
| 2009/0032687 A1 | 2/2009 | Lapstun |
| 2009/0046749 A1 | 2/2009 | Mizuuchi |
| 2009/0050204 A1 | 2/2009 | Habib |
| 2009/0057650 A1 | 3/2009 | Lieber |
| 2009/0127442 A1 | 5/2009 | Lee |
| 2009/0146198 A1 | 6/2009 | Joe |
| 2009/0151782 A1 | 6/2009 | Ko |
| 2009/0152664 A1* | 6/2009 | Klem et al. .................. 257/440 |
| 2009/0165844 A1 | 7/2009 | Dutta |
| 2009/0173976 A1 | 7/2009 | Augusto |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Wang |
| 2009/0199597 A1 | 8/2009 | Danley |
| 2009/0201400 A1 | 8/2009 | Zhang |
| 2009/0224245 A1 | 9/2009 | Umezaki |
| 2009/0233445 A1 | 9/2009 | Lee |
| 2009/0243016 A1 | 10/2009 | Kawahara |
| 2009/0244514 A1 | 10/2009 | Jin |
| 2009/0260687 A1 | 10/2009 | Park |
| 2009/0266974 A1 | 10/2009 | Verhulst |
| 2009/0272423 A1 | 11/2009 | Niira |
| 2009/0278998 A1 | 11/2009 | El-Ghoroury |
| 2009/0289320 A1 | 11/2009 | Cohen |
| 2009/0305454 A1 | 12/2009 | Cohen |
| 2010/0006817 A1 | 1/2010 | Ohlsson |
| 2010/0019252 A1 | 1/2010 | Bratkovski |
| 2010/0019296 A1 | 1/2010 | Cha |
| 2010/0019355 A1 | 1/2010 | Kamins |
| 2010/0104494 A1 | 4/2010 | Meng |
| 2010/0116976 A1 | 5/2010 | Wober |
| 2010/0132779 A1 | 6/2010 | Hong |
| 2010/0133986 A1 | 6/2010 | Kim |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0187404 A1* | 7/2010 | Klem et al. .................. 250/208.1 |
| 2010/0200065 A1 | 8/2010 | Choi |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke |
| 2010/0244169 A1 | 9/2010 | Maeda |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0282314 A1 | 11/2010 | Coakley |
| 2010/0295019 A1 | 11/2010 | Wang |
| 2010/0304061 A1 | 12/2010 | Ye |
| 2010/0308214 A1 | 12/2010 | Wober |
| 2010/0320444 A1 | 12/2010 | Dutta |
| 2011/0036396 A1 | 2/2011 | Jayaraman |
| 2011/0037133 A1 | 2/2011 | Su |
| 2011/0080508 A1 | 4/2011 | Katsuno |
| 2011/0133060 A1 | 6/2011 | Yu |
| 2011/0133160 A1 | 6/2011 | Yui |
| 2011/0135814 A1 | 6/2011 | Miyauchi |
| 2011/0139176 A1 | 6/2011 | Cheung |
| 2011/0147870 A1 | 6/2011 | Ang |
| 2011/0180894 A1 | 7/2011 | Samuelson |
| 2011/0195577 A1 | 8/2011 | Kushibiki |
| 2011/0226937 A1 | 9/2011 | Yu |
| 2011/0253982 A1 | 10/2011 | Wang |
| 2011/0272014 A1 | 11/2011 | Mathai |
| 2011/0309237 A1 | 12/2011 | Seo |
| 2011/0315988 A1 | 12/2011 | Yu |
| 2011/0316106 A1 | 12/2011 | Kim |
| 2012/0009714 A1 | 1/2012 | Mouli |

FOREIGN PATENT DOCUMENTS

| | | |
|---|---|---|
| JP | 2007201091 | 8/2007 |
| WO | 8603347 | 6/1986 |
| WO | 0002379 | 1/2000 |
| WO | 2005064337 | 7/2005 |
| WO | 2008069565 | 6/2008 |
| WO | 2008079076 | 7/2008 |
| WO | 2008131313 | 10/2008 |
| WO | 2008135905 | 11/2008 |
| WO | 2008143727 | 11/2008 |
| WO | 2009116018 | 9/2009 |
| WO | 2009137241 | 11/2009 |
| WO | 2010019887 | 2/2010 |
| WO | 2010039631 | 4/2010 |

OTHER PUBLICATIONS

Adler, Nanowire Lawns Make for Sheets of Image Sensors, NewScientist.com, Jul. 28, 2008.

Babinec et al., High-Flux, Low-Power Diamond Nanowire Single-Photen Source Arrays: An Enabling Material for Optical and Quantum Computing and Cryptography, obtained on Jul. 22, 2010 at URL: http://otd.harvard.edu/technologies/tech.php?case=3702.

Ballie et al., 'Zero-space microlenses for CMOS image sensors: optical modeling and lithographic process Development', Publication Date May 2004, http://adsabs.harvard.edu/abs/2004SPIE.5377.953B, pp. 1-2.

Baomin Wang and Paul W. Leu, Nanotechnology 23 (2012) 194003, 7 pages.

Barclay at al., Chip-Based Microcavities Coupled to NV Centers in Single Crystal Diamond, Applied Physics Letters, Nov. 12, 2000, vol. 95, Issue 19.

Brouri et al., Photon Antibunching in the Flurescence of Individual Colored Centers in Diamond, Optics Letters, Sep. 1, 2000, vol. 25, Issue 17.

Chung, Sung-Wook et al. Silicon Nanowire Devices. Applied Physics Letters, vol. 76, No. 15 (Apr. 10, 2000), pp. 2068-2070.

CMOS image sensor pixel microlens array optimization using FDTD Solutions, http://www.lumerical_com/fdtd_microlens/cmos_image_sensor_pixel_microlens,php, pp. 1-2, Jun. 25, 2008.

CMOS image sensor pixel optical efficiency and optical crosstalk optimization using FDTD Solutions' www.lumerical.com/fdtd_microlens/cmos_image_sensor_pixel_microlens.php, Mar. 19, 2009.

Deptuch et al., Vertically Integrated Circuits at Fermilab, IEEE Transactions on Nuclear Science, Aug. 2010, vol. 54, Issue 4, pp. 2178-2186.

Ekroll, On the Nature of Simultaneous Color Contrast, Dissertation, University of Kiel, 2005.

Fan et al., Large-Scale, Heterogeneous Integration of Nanowire Arrays for Image Sensor Circuitry, Proceedings of the National Academy Sciences (PNAS) of the United States of America, Aug. 12, 2008, vol. 105, No. 32.

Fang et al., Fabrication of Slantingly-Aligned Silicon Nanowire Arrays for Solar Cell Applications, Nanotechnology, 2008, vol. 19, No. 25.

Furumiya, et al. 'High-sensitivity and no-crosstalk pixel technology for embedded CMOS image sensor'; IEEE Electron Device Letters, vol. 48, No. 10, Oct. 2001.

Gadelrab et al., The Source-Gated Amorphous Silicon Photo-Transistor, IEEE Transactions on Electron Devices, Oct. 1997, vol. 44, No. 10, pp. 1789-1794.

Gambino et al., 'CMOS Imager with Copper Wiring and Lightpipe,' Electron Devices Meetin, 2006. IEDM '06, International Publication Date: Dec. 11-13, 2006, pp. 1-4.

Garnett et al., Light Trapping in Silicon Nanowire Solar Cells, Nanoletters, Jan. 28, 2010, vol. 10, No. 3, pp. 1082-1087.

Ge et al., Orientation-Controlled Growth of Single-Crystal Silicon-Nanowire Arrays, Advanced Materials, Jan. 18, 2005, vol. 17, No. 1, pp. 56-61.

Guillaumée, et al., Polarization Sensitive Silicon Photodiodes Using Nanostructured Metallic Grids, Applied Physics Letters 94, 2009.

Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.

Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.

Hochbaum et al., Controlled Growth of Si Nanowire Arrays for Device Integration, Nano Letters, Mar. 2005, vol. 5, No. 3, pp. 457-460.

Holmes et al., Control of Thickness and Orientation of Solution-Grown Silison Nanowires, Science, Feb. 25, 2000, vol. 287, No. 5457, pp. 1471-1473.

International Preliminary Report and Written Opinion re PCT/US2010-059468, mailed Jun. 21, 2012.

International Preliminary Report and Written Opinion re PCT/US2010/059491, mailed Jun. 21, 2012.

International Preliminary Report and Written Opinion re PCT/US2010/059496, mailed Jun. 21, 2012.

International Preliminary Report and Written Opinion re PCT/US2010/059504, mailed Jun. 21, 2012.

International Preliminary Report on Patentability for PCT International Application No. PCT/US2010/035722, mailed Nov. 3, 2011.

International Preliminary Report on Patentability for PCT International Patent Application No. PCT/US2009/055963, mailed Mar. 17, 2011.

International Search Report and Written Opinion for PCT International Application No. PCT/US2010/035722, mailed Jul. 20, 2010.

International Search Report and Written Opinion for PCT International Appilcation No. PCT/US2010/035726, mailed Jul. 21 2010.

International Search Report and Written Opinion for PCT International Application No. PCT/US2010/057227, mailed Jan. 26, 2011.

International Search Report and Written Opinion for No. PCT/US2009/055963, mailed Oct. 15, 2009.

International Search Report and Written Opinion for No. PCT/US2009/063592, mailed Jan. 13, 2010.

International Search Report and Written Opinion for No. PCT/US2010/035727, mailed Sep. 27, 2010.

International Search Report and Written Opinion for PCT International Patent Application No. PCT/US2010/051435, mailed Dec. 3, 2010.

International Search Report and Written Opinion for PCT International Patent Application No. PCT/US2010/051446, mailed. Jan. 3, 2011.

International Search Report and Written Opinion for PCT International Patent Application No. PCT/US2010/059468, mailed Feb. 11, 2011.

International Search Report and Written Opinion for PCT International Patent Application No. PCT/US2010/059491, mailed Feb. 9, 2011.

International Search Report and Written Opinion for PCT International Patent Application No. PCT/US2010/059501, mailed Feb. 15, 2011.

International Search Report and Written Opinion for PCT International Patent Application No. PCT/US2010/059504, mailed Apr. 7, 2011.

International Search Report and Written Opinion for PCT International Patent Application No. PCT/US2011/060348, mailed Mar. 9, 2012.

International Search Report and Written Opinion for PCT International Patent Application No. PCT/US2011/064635, mailed Apr. 13, 2012.

International Search Report and Written Opinion for PCT International Patent Application No. PCT/US2011/066097, mailed Mar. 12, 2012.

International Search Report and Written Opinion for PCT International Patent Application No. PCT/US2011/067712, mailed May 3, 2012.

International Search Report and Written Opinion re PCT/US2011/57325, mailed Jun. 22, 2012.

Jin-Kon Kim; 'New Functional Nanomaterials Based on Block Copolymers' http://www.ziu.edu.cn/adver/subjectizyhd/jz0707061313.html, Jul. 7, 2011.

Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.

Junger, et al., Polarization- and wavelength-sensitive sub-wavelength structures fabricated in the metal layers of deep submicron CMOS processes, Proc. of SPIE, vol. 7712, 2010.

Kalkofen et al., Atomic Layer Deposition of Boron Oxide as Dopant Source for Shallow Doping of Silicon, Meeting Abstract 943, 217th ECS Meeting, MA2010-01, Apr. 25-30, 2010, Vancouver Canada, El—Advanced Gate Stack, Source/Drain, and Kane, Why Nanowires Make Great Photodetectors, EurekAlert.com article, Apr. 25, 2007.

Kempa, Thomas J. et al. Single and Tandem Axial p-i-n Nanowire Photovoltaic Devices, Nano Letters, 2008, vol. 8, No. 10, 3456-3460.

Kim et al., Electronic Structure of Vertically Aligned Mn-Doped CoFe2O4 Nanowires and Their Application as Humidity Sensors and Photodetectors, Journal of Physical Chemistry C, Apr. 7, 2009.

Law, et al., 'Semiconductor Nanowires and Nanotubes'; Annu. Rev. Mater. Res. 2004, 34:83-122.

Lee et al., Vertical Pillar-Superlattice Array and Graphene Hybrid Light Emitting Diodes, Nano Letters, 2010, vol. 10, pp. 2783-2788.

Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.

Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.

Loncar et al., Diamond Nanotechnology, SPIE Newsroom, May 18, 2010, obtained at url: http://spie.org/x40194.xml?ArticleID=x40194.

Loose et al., CMOS Detector Technology, Scientific Detector Workshop, Sicily, 2005, Experimental Astronomy, vol. 19, Issue 1-3, pp. 111-134.

Lu et al., Growth of Single Crystal Silicon Nanowires in Supercritical Solution from Tethered Gold Particles on Silicon Substrate, NanoLetters, Jan. 2003, vol. 3, No. 1, pp. 93-99.

Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.

Madou, Properties and Growth of Silicon, Including Crystalline Silicon, Fundamentals of Microfabrication, 2nd Ed., CRC Press, 2002, pp. 125-204.

Makarova et al., Fabrication of High Density, High-Aspect-Ratio Polyimide Nanofilters, Journal of Vacuum Science and Technology, Nov./Dec. 2009, vol. 27, No. 6., pp. 2585-2587.

Morales et al., A Laser Abiation Method for the Synthesis of Crystalline Semiconductor Nanowires, Science, Jan. 9, 1998, vol. 279, pp. 208-211.

N.L. Dmitruk, et al.; 'Modeling and Measurment of Optical Response of 1D Array of Metallic Nanowires for Sensing and Detection Application'; 26th International Conference on Microelectronics (MIEL 2008), NIS, Serbia, May 11-14, 2008.

Nguyen et al., Deep Reactive Ion etching of Polyimide for Microfluidic Applications, Journal of the Korean Physical Society, Sep. 2007, vol. 51. No. 3, pp. 984-988.

Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.

Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.

Parraga et al., Color and Luminance Information In Natural Scenes, Journal of Optical Society of America A, Optics, Image, Science and Vision, Jun. 1998. vol. 15, No. 6.

Reynard Corporation; 'Anti-Reflection Coatings (AR)', http://www.reynardcorp.com/coating_anti_reflection.php, undated.

Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.

Rugani, First All-Nanowire Sensor, Technology Review, Aug. 13, 2008, Published by MIT.

Rutter, Diamond-Based Nanowire Devices Advance Quantum Science, SEAS Communications, Feb. 14, 2010, obtained at url:http://news.harvard.edu/gazette/story/2010/02/digging-deep-into-diamonds/.

Sangmoo Jeon, et al., Nano Lett. 2012, 12, 2971-2976.

Sangmoo Jeong et al., J. Vac. Sci. Technol. A 30(6), Nov./Dec. 2012.

Sarkar et al., Integrated polarization-analyzing CMOS image sensor for detecting incoming light ray direction, Sensors Application Symposium (SAS), Mar. 29, 2012, p. 194-199, 1010 IEEE.

Schmidt et al., Realization of Silicon Nanowire Vertical Surround-Gate Field-Effect Transistor, Small, Jan. 2006, vol. 2, No. 1, pp. 85-88.

Shimizu et al., Homoepitaxial Growth of Vertical Si Nanowires on Si(100) Substrate using Anodic Aluminum Oxide Template, (abstract only), Materials Research Society, Fall 2007.

Song et al., Vertically Standing Ge Nanowires on GaAs(110) Substrate, Nanotechnology 19, Feb. 21, 2008.

T. H. Hsu, et al. 'Light Guide for Pixel Crosstalk Improvement in Deep Submicron CMOS Image Sensor'; IEEE Electron Device Letters, vol. 25, No. 1, Jan. 2004.

Thelander et al., Nanowire-Based One-Dimensional Electronics, Materials Today, Oct. 2006, vol. 9, No. 10, pp. 28-35.

Trentler, Timothy J. et al. Solution-Liquid-Solid Growth of Crystalline III-V Semiconductors: An Analogy to Vapor Liquid-Solid Growth. vol. 270(5243), Dec. 15, 1995, pp. 1791-1794.

Tseng, et al. 'Crosstalk improvement technology applicable to 0.14μm CMOS image sensor'; IEEE International Electron Devices Meeting, Dec. 13-15, 2004; IEDM Technological Digest, pp. 997-1000.

Verheijen, Marcel A. et al. Growth Kinetics of Heterostructured GaP-GaAs Nanowires. J. Am. Chem. Soc. 2006, 128, 1353-1359.

Wagner, R.S. and Ellis, W.C. Vapor-Liquid-Solid Mechanism of Single Crystal Growth. Applied Physics Letters. vol. 4, No. 5 (Mar. 1, 1964), pp. 89-90.

Wang, Introduction to Nanotechnology—Where Oppurtunities arise Great Future Being Built from Small Things, Fall 2008.

William Shockley and H. Queisser, Detailed Balance Limit of Efficiency of p-n Junction Solar Cells, J. of Appl. Physics, 1961, Mar. 32(3).

Wong et al., Lateral Nanoconcentrator Nanowire Multijunction Photovoltaic Cells, GCEP Progress report, Apr. 20, 2009, pp. 1-18.

Ye et al., Fabrication Techniques of High Aspect Ratio Vertical Lightpipes Using a Dielectric Photo Mask, SPIE, Proceedings, Feb. 2010, vol. 7591.

Zhang et al., Ultrahigh Responsivity Visible and Infrared Detection Using Silicon Nanowire Phototransistors, Nanoletters, May 14, 2010, vol. 10, No. 6, pp. 2117-2120.

U.S. Final Office Action for U.S. Appl. No. 13/494,661, mailed Mar. 7, 2013, 10 pages.

U.S. Final Office Action for U.S. Appl. No. 12/966,514, mailed Mar. 19, 2013, 50 pages.

* cited by examiner

DETERMINATION OF OPTIMAL DIAMETERS FOR NANOWIRES

CROSS REFERENCE TO RELATED APPLICATIONS

This application is a continuation of U.S. patent application Ser. No. 12/472,264, filed on May 26, 2009, which will issue on Sep. 18, 2012. The disclosure of the prior application is considered part of and is incorporated by reference in the disclosure of this application.

FIELD OF INVENTION

The embodiments relate to nanowire devices, more particularly, to manufacturing nanowire image sensors.

BACKGROUND

An image sensor has a large number of sensor elements (pixels), generally greater than 1 million, in a Cartesian (square) grid. Conventional color image sensors are fabricated with colored filters arranged in a Bayer configuration. An Example of a convention Bayer configuration is illustrated in FIG. 6. The color scheme includes red, green, and blue filters (RGB). The Bayer filter pattern is 50% green, 25% red and 25% blue, hence is also referred to GRGB or other permutation such as RGGB. Twice as many green elements as red or blue are used to mimic the human eye's greater resolving power with green light. Since each pixel is filtered to record only one of three colors, the data from each pixel cannot fully determine color on its own. To obtain a full-color image, various demosaicing algorithms can be used to interpolate a set of complete red, green, and blue values for each point in the sensed scene.

Indeed, to obtain the full color image of the scene, data from all three color filters is required. Because data from all three color filters is required and each row of filters only has two types of color filter, at least two rows of pixels must be used to reproduce the scene using a Bayer configuration. This, in turn, has implications on the performance of image processing. Conventional digital image processors process one row at a time. Therefore, at least one row of sensor data must be held in a buffer while data from the next row is processed. In this manner, red, green, and blue data for each point in the image can be processed, however, it comes at the cost of processing speed.

One challenge of a designer of color image sensors is to consistently align the color response of the sensor pixels to the response curve of the human eye. Filter-based color sensors are device dependent. That is, different devices detect or reproduce different RGB values. The RGB values typically vary from manufacturer to manufacturer based on the manufacturer's selection of dye or phosphor used to make their filters. Further, filter degradation over time may even lead to variations in the RGB values over time in the same device.

The layers of a typical sensor are listed in Table I and shown in FIG. 1.

TABLE I

| | Typical Layer Description | Thickness (µm) |
|---|---|---|
| 15 | OVERCOAT | 2.00 |
| 14 | MICRO LENS | 0.773 |
| 13 | SPACER | 1.40 |
| 12 | COLOR FILTER | 1.20 |

TABLE I-continued

| | Typical Layer Description | Thickness (µm) |
|---|---|---|
| 11 | PLANARIZATION | 1.40 |
| 10 | PASS3 | 0.600 |
| 9 | PASS2 | 0.150 |
| 8 | PASS1 | 1.00 |
| 7 | IMD5B | 0.350 |
| 6 | METAL3 | 31.18 |
| 5 | IMD2B | 0.200 |
| 4 | METAL2 | 21.18 |
| 3 | IMD1B | 0.200 |
| 2 | METAL1 | 1.18 |
| 1 | ILD | 0.750 |

In Table I, typically the first layer on a silicon substrate is the ILD layer and the topmost layer is the overcoat. In Table I, ILD refers to a inter-level dielectric layer, METAL1, METAL2 and METAL3 refer to different metal layers, IMD1B, IMD2B and IMD5B refer to different inter-metal dielectric layers which are spacer layers, PASS1, PASS2 and PASS3 refer to different passivation layers (typically dielectric layers).

The total thickness of the layers above the silicon substrate of the image sensor is the stack height (s) of the image sensor and is the sum of the thickness of the individual layers. In the example of Table I, the sum of the thickness of the individual layers is typically about 11.6 micrometers (µm).

The space above the photosensitive element of a pixel must be transparent to light to allow incident light from a full color scene to impinge on the photosensitive element located in the silicon substrate. Consequently, no metal layers are routed across the photosensitive element of a pixel, leaving the layers directly above the photosensitive element clear.

The pixel pitch to stack height ratio (p/s) determines the cone of light (F number) that can be accepted by the pixel and conveyed to the photosensitive element on the silicon. As pixels become smaller and the stack height increases, this number decreases, thereby lowering the efficiency of the pixel.

More importantly, an increased stack height with greater number of metal layers obscure the light from being transmitted through the stack to reach the photosensitive element, in particular of the rays that impinge the sensor element at an angle. One solution is to decrease the stack height by a significant amount (i.e., >2 µm). However, this solution is difficult to achieve in a standard CMOS process.

Another issue, which possibly is the one that most limits the performance of the conventional image sensors, is that less than about one-third of the light impinging on the image sensor is transmitted to the photosensitive element such as a photodiode. In the conventional image sensors, in order to distinguish the three components of light so that the colors from a full color scene can be reproduced, two of the components of light are filtered out for each pixel using a filter. For example, the red pixel has a filter that absorbs green and blue light, only allowing red light to pass to the sensor.

Other issues may also affect the efficiency of the pixel. For example, the difference in refractive index between the microlens 14 and the overcoat layer 15 will cause some of the incident photons to reflect off the overcoat rather than be transmitted to the photosensitive element. Typically, the difference between the refractive indices of air (n=1.0) and a typical polymer (n=1.5) overcoat 15 is small, resulting in a small reflective loss. Another, larger reflective loss, however, is generated at the boundary between the inter-level dielectric layer 1 (n=1.5) and the substrate 20 (n=4-5). This is due to the larger difference between the refractive indices of the inter-level dielectric layer 1 (n=1.5) and a typical silicon substrate 20 (n=4-5). Another loss may occur due to the incident light hitting the overcoat at too severe an angle and not being transmitted to the photosensitive element. Additionally, real devices have a quantum efficiency less than 100%. That is, even when photons reach the photosensitive element, a finite number of them do not produce a signal.

Another issue that plagues image sensors is crosstalk. Crosstalk is a phenomenon by which a signal transmitted in one pixel or channel of a transmission system creates an undesired effect in another pixel or channel. For optical sensors, there are at least three types of crosstalk: (1) spatial optical crosstalk, (2) spectral crosstalk, and (3) electrical crosstalk. Spatial optical crosstalk occurs when the pixel size approaches the wavelength of visible light. Diffraction causes a sharp increase in the amount of light that reaches adjacent photodiodes rather than the desired photodiode. Spectral crosstalk is when light that should have been blocked by a color filter manages to pass through the filter. Electrical crosstalk is when photo-generated electrons travel to adjacent pixels through the silicon substrate.

The development of nanoscale technology and in particular the ability to produce nanowires has opened up possibilities of designing structures and combining materials in ways not possible in planar technology. One basis for this development is that the material properties of a nanowire makes it possible to overcome the requirement of placing a color filters on each photo diode of an image sensor and to significantly increase the collection of all the light that impinges on the image sensor.

Nanowires of silicon can be grown on silicon without defects. In US 20040075464 by Samuelson et al. a plurality of devices based on nanowire structures are disclosed.

DETAILED DESCRIPTION

Figure 1:
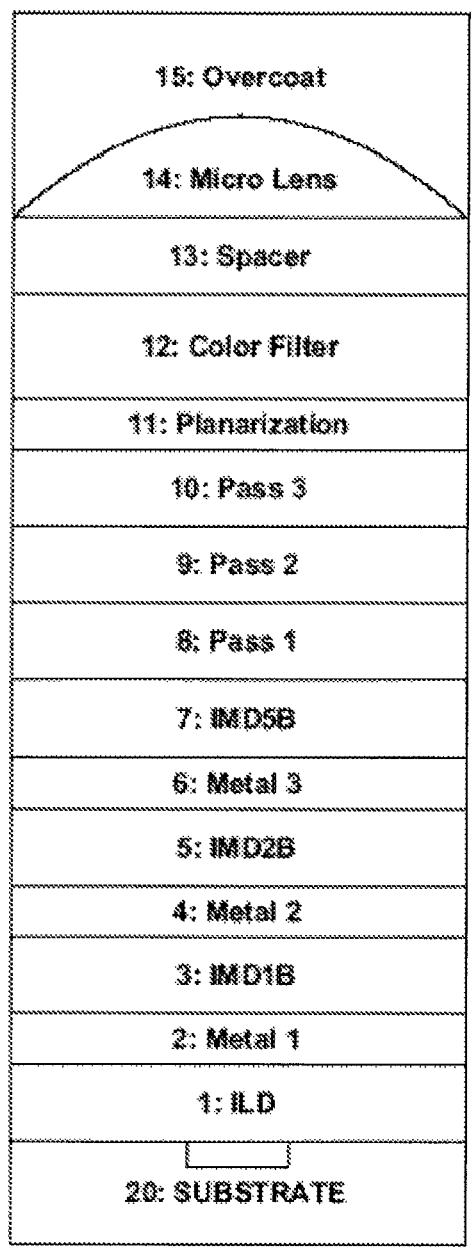
FIG. 1 shows a cross sectional view of a conventional image sensor.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

This disclosure is drawn, inter alfa, to methods, apparatus, systems, and devices related to an image sensor and nanowire pixels. An embodiment relates to a method for optimizing the diameter of the nanowires of an image sensor. Another embodiment relates to a first method of scene reconstruction by transforming digitized response from an array of nanowire photodiode devices by calculating the red, green, and blue color of the scene. Another embodiment relates to a second method of scene reconstruction by transforming digitized response from an array of nanowire photodiode devices by calculating the luminance and chrominance of the scene. In the first scene reconstruction method, the scene is reconstructed by stepping across the array of nanowire photodiode devices one photodiode at a time. In the second scene reconstruction method, the scene is reconstructed by stepping across the array of nanowire photodiode devices two photodiodes at a time. Another embodiment relates to a device having at least two different pixels that include nanowire photodiodes having nanowires with diameters optimized to minimize the differences between the spectral response of the device and the human eye. The response of the human eye may be taken from a standard spectral response curve. Another embodiment relates to a computer readable medium which is configured to simulate the spectral response of a nanowire photodiode and determine the error difference between the spectral response of a nanowire photodiode of a predetermined diameter and the human eye. The simulation may be used to determine the optimal diameter of the nanowire in the nanowire photodiode to minimize the difference between the nanowire photodiode and the human eye.

An embodiment relates to a method of determining a diameter for a nanowire for a nanowire device comprising providing a first nanowire device comprising at least a first pixel and a second pixel, wherein the first pixel comprises a first nanowire comprising a predetermined material and a predetermined diameter, the first pixel configured to detect a first predetermined color and a first complementary color of the first predetermined color, and the second pixel comprises a second nanowire comprising a second predetermined material and a second predetermined diameter, the second pixel configured to detect a second predetermined color and a second complementary color of the second predetermined color, determining a first error difference between a first predetermined color spectral response of the first predetermined color of the first nanowire and one or more standard spectral response curves, determining a second error difference between a first complimentary color spectral response of the first complementary color of the first nanowire and one or more standard spectral response curves, determining a third error difference between a second predetermined color spectral response of the second predetermined color of the second nanowire and the one or more standard spectral response curves and determining a fourth error difference between a second complimentary color spectral response of the second complementary color of the second nanowire and the one or more standard spectral response curves, and determining a total error difference from the first, second, third, and fourth error differences.

In one aspect of this embodiment, the method further comprising providing a plurality of additional nanowire devices, each of the additional nanowire devices comprising at least an additional first pixel and an additional second pixel, wherein each of the additional first pixels comprises an additional first nanowire comprising the same predetermined material as the first nanowire but having a different diameter from each of the other additional first nanowires and from the first nanowire and each of the additional second pixels comprise an additional second nanowire comprising the same predetermined material as the second nanowire but having a different diameter from each other second additional nanowires and from the second nanowire determining the total error differences between spectral responses of the plurality of additional nanowire devices and the one or more standard spectral response curves and determining the diameters of the nanowires of the nanowire device of the first nanowire device and the plurality of additional nanowire devices that produces the least error difference between the spectral responses with standard spectral response curves.

In another aspect of this embodiment, the standard spectral response curves are Smith-Pokorny eye response spectral curves. In another aspect, the standard spectral response curves are CIE standard observer curves. Preferably, the total least error difference is determined with a least squares analysis. In one aspect of the embodiment, the first pixel is configured to detect blue and yellow and the second pixel is configured to detect cyan and red.

In another aspect, the first pixel is configured to detect blue and yellow and the second pixel is configured to detect cyan and red and determining the first, second, third, and fourth error differences between the spectral response of the spectral responses of the first and second nanowires and the Smith-Pokorny eye response spectral curves comprises determining the constants in the following equations:

$$Rsp \sim Ayr*Ynw+Abr*Bnw+Arr*Rnw+Acr*Cnw,$$

$$Gsp \sim Ayg*Ynw+Abg*Bnw+Arg*Rnw+Acg*Cnw,$$

$$Bsp \sim Ayb*Ynw+Abb*Bnw+Arb*Rnw+Acb*Cnw,$$

where Rsp, Gsp, and Bsp are the Smith-Pokorny eye response spectral curves, Ynw (yellow), Bnw (blue) and Rnw (red), and Cnw (cyan) are the spectral responses of the first and second nanowires, respectively, and Ayr, Abr, Arr, Acr, Ayg, Abg, Arg, Acg, Ayb, Abb, Arb, and Acb are constants.

In another aspect, the nanowire device comprises an optical pipe comprising a core and a cladding, wherein the core is configured to transmit light with wavelengths up to the predetermined color. In an aspect, the first nanowire has a diameter of approximately 60 nm and the second nanometer has a diameter of approximately 80 nm when the material used for the construction of the nano wire is Si. In another aspect, the method further comprises fabricating a sensor array having a plurality of first and second pixels. In another aspect, the sensor array comprises rows and columns of alternating first and second pixels.

Another embodiment relates to a method of scene reconstruction comprising receiving digitized responses of an array of nanowire photodiode devices, the array comprising a alternating plurality of first nanowire photodiode devices and second nanowire photodiode devices, the first nanowire photodiode devices configured to detect a first color and a first complementary color complementary to the first color and the second nanowire photodiode devices configured to detect a second color and a second complementary color complementary to the second color and transforming the digitized responses by stepping across a row of alternating first and second nanowire photodiode devices and successively calculating the red, green, and blue scene color from a pair of adjacent first and second nanowire photodiode devices, wherein stepping across the row is performed one nanowire photodiode device at a time. In aspect of the embodiment, transforming the digitized responses comprises calculating the red, green, and blue scene color with the following equations for a first yellow/blue nanowire photodiode device adjacent to a second red/cyan nanowire photodiode device:

$$R1 = Ayr*Y1+Abr*B1+Arr*R2+Acr*C2,$$

$$G1 = Ayg*Y1+Abg*B1+Arg*R2+Acg*C2,$$

$$B1 = Ayb*Y1+Abb*B1+Arb*R2+Acb*C2,$$

where Y1, B1 and R2, C2, are spectral responses of the first yellow/blue nanowire photodiode device and the second red/cyan nanowire photodiode device, respectively, and Ayr, Abr, Arr, Acr, Ayg, Abg, Arg, Acg, Ayb, Abb, Arb, and Acb are constants.

In another aspect, transforming the digitized responses comprises calculating the red, green, and blue scene color with the following equations for a third yellow/blue nanowire photodiode device adjacent to the second red/cyan nanowire photodiode device:

$$R2 = Ayr*Y3+Abr*B3+Arr*R2+Acr*C2,$$

$$G2 = Ayg*Y3+Abg*B3+Arg*R2+Acg*C2,$$

$$B2 = Ayb*Y3+Abb*B3+Arb*R2+Acb*C2,$$

Where Y3, B3 and R2, C2 are spectral responses of the third yellow/blue nanowire photodiode device and the second red/cyan nanowire photodiode device, respectively, and Ayr, Abr, Arr, Acr, Ayg, Abg, Arg, Acg, Ayb, Abb, Arb, and Acb are constants.

Another embodiment relates to a method of scene reconstruction comprising receiving digitized responses of an array of nanowire photodiode devices, the array comprising an alternating plurality of first nanowire photodiode devices and second nanowire photodiode devices, the first nanowire photodiode devices configured to detect a first color and a first complementary color complementary to the first color and the second nanowire photodiode devices configured to detect a second color and a second complementary color complementary to the second color and transforming the digitized responses by stepping across a row of alternating first and second nanowire photodiode devices and successively calculating the luminance and chrominance of the scene from a pair of adjacent first and second nanowire photodiode devices, wherein stepping across a row is performed a pair of nanodiode devices at a time.

In one aspect of the embodiment, transforming the digitized responses comprises calculating the luminance and chrominance of the scene with the following equations for a first yellow/blue nanowire photodiode device adjacent to a first red/cyan nanowire photodiode device:

Luminance1 = $Ly*Y1+Lb*B1$

Luminance2 = $Lr*R2+Lc*C2$

Chrominance1 = $Ayu*Y1+Abu*B1+Aru*R2+Acu*C2$

Chrominance2 = $Ayv*Y1+Abv*B1+Arv*R2+Acv*C2$ where Y1, B1 and R2, C2 are the spectral responses of the first and second nanowire photodiode devices, respectively, and Ly, Lb, Lr, Lc, Ayu, Ayv, Abu, Abv, Aru, Arv, Acu, and Acv are constants. Another aspect further comprises using a 4:2:2 subsampling in which the output pixel data stream is arranged in luminance chrominance sequence such as: Luminance1, Chrominance1, Luminance2, Chrominance2, . . . .

Another embodiment relates to a device comprising at least a first pixel and a second pixel, wherein the first pixel comprises a first nanowire comprising a predetermined material and a predetermined diameter, the first pixel configured to detect a first predetermined color and a first complementary color of the first predetermined color and the second pixel comprises a second nanowire comprising a second predetermined material and a second predetermined diameter, the second pixel configured to detect a second predetermined color and a second complementary color of the second predetermined color, wherein the first nanowire and the second nanowire have diameters which were determined to produce the least total error difference between spectral responses of the first and second pixels with standard spectral response curves. In one aspect, the device is an optical sensor. In another aspect, the standard spectral response curves are Smith-Pokorny eye response spectral curves. In another aspect, the standard spectral response curves are CIE standard observer curves. Preferably, the least total error difference is determined with a least squares analysis.

In one aspect of the embodiment, the first pixel comprises a first light pipe comprising the first nanowire and a first cladding surrounding the first nanowire and the second pixel comprises a second light pipe comprising the second nanowire and a second cladding surrounding the first nanowire. In another aspect, the first pixel comprises a first light pipe comprising only first nanowire and a cavity surrounding the first nanowire and the second pixel comprises a second light pipe comprising the second nanowire and a second cavity surrounding the first nanowire. In this aspect, the complementary colors are detected with a photodiodes in the substrate of the first and second pixels. In another aspect, the first pixel further comprises a reflective surface surrounding the first light pipe and the second pixel further comprises a reflective surface surrounding the second light pipe. In another aspect, the first pixel comprises a first substrate and a first photodiode in the first substrate, the second pixel comprises a second substrate and a second photodiode in the second substrate. In another aspect, the first complementary color is detected by the first photodiode in the first substrate and the second complementary color is detected by the second photodiode in the second substrate.

Another embodiment relates to a tangible computer readable medium comprising computer executable instructions for simulating a first nanowire device comprising at least a first pixel and a second pixel, wherein the first pixel comprises a first nanowire comprising a predetermined material and a predetermined diameter, the first pixel configured to detect a first predetermined color and a first complementary color of the first predetermined color and the second pixel comprises a second nanowire comprising a second predetermined material and a second predetermined diameter, the second pixel configured to detect a second predetermined color and a second complementary color of the second predetermined color and determining the error difference between a spectral response of the first pixel and the second pixel with standard spectral response curves.

One aspect of the embodiment, the computer readable medium further comprises instructions for simulating a plurality of additional nanowire devices, each of the additional nanowire devices comprising at least an additional first pixel and an additional second pixel, wherein each of the additional first pixels comprises an additional first nanowire comprising the same predetermined material as the first nanowire but having a different diameter from each of the other additional first nanowires and from the first nanowire and each of the additional second pixels comprise an additional second nanowire comprising the same predetermined material as the second nanowire but having a different diameter from each other second additional nanowires and from the second nanowire, determining the error difference between the spectral responses of the plurality of additional nanowire devices and one or more standard spectral response curves and determining the diameters of the nanowires of the nanowire device of the first nanowire device and the plurality of additional nanowire devices that produces the least total error difference between the spectral responses with standard spectral response curves. In another aspect, the least error difference is determined with a least squares analysis.

A waveguide has a cutoff wavelength that is the lowest frequency that the waveguide can propagate. As a result, an ideal waveguide in the core whose cutoff wavelength is at green will not propagate red light, and an ideal waveguide in the core whose cutoff wavelength is at blue will not propagate red and green light. Real waveguides, of course, will suffer some spectral crosstalk. That is, a real waveguide in the core whose cutoff wavelength is at green will propagate a small amount of red light and an real waveguide in the core whose cutoff wavelength is at blue will propagate a small amount of red and green light. In one implementation, a first pixel includes a blue waveguide embedded within a white waveguide, which could be in the cladding. A second pixel includes a cyan (blue/green waveguide) embedded within a white waveguide cladding. Preferably, blue light remains in the blue waveguide core, while blue and/or green light remains in the cyan waveguide of the second core. Preferably the remainder of the light remains in the white waveguide in one or more the claddings.

An optical pipe is an element to confine and transmit an electromagnetic radiation that impinges on the optical pipe. The optical pipe can include a core and a cladding.

A core and a cladding are complementary components of the optical pipe and are configured to separate wavelengths of an electromagnetic radiation beam incident on the optical pipe at a selective wavelength through the core and cladding. An active element is any type of circuit component with the ability to electrically control electron and/or hole flow (electricity controlling electricity or light, or vice versa). Components incapable of controlling current by means of another electrical signal are called passive elements. Resistors, capacitors, inductors, transformers, and even diodes are all considered passive elements. Active elements in embodiments disclosed herein include, but are not limited to, an active waveguide, transistors, silicon-controlled rectifiers (SCRs), light emitting diodes, and photodiodes. A waveguide is a system or material designed to confine and direct electromagnetic radiation of selective wavelengths in a direction determined by its physical boundaries. Preferably, the selective wavelength is a function of the diameter of the waveguide. An active waveguide is a waveguide that has the ability to electrically control electron and/or hole flow (electricity controlling electricity or light, or vice versa). This ability of the active waveguide, for example, is one reason why the active waveguide could be considered to be "active" and within the genus of an active element.

An embodiment relates to methods to enhance the transmission of light to optically active devices on an integrated circuit (IC). In some embodiments, the device is configured to resolve black and white or luminescence information contained in the electromagnetic radiation by appropriate combinations of energies of the electromagnetic radiation detected in the core and the cladding.

In the embodiments disclosed herein, preferably, the core comprises a waveguide. Preferably, the active element is configured to be a photodiode, a charge storage capacitor, or combinations thereof. More preferably, the core comprises a waveguide comprising a semiconductor material. The device could further comprise a passivation layer around the waveguide in the core. The device could further comprise a metal layer around the waveguide in the core. The device could further comprise a metal layer around the passivation layer. Preferably, the device comprises no color or IR filter.

The optical pipe may be circular, non-circular or conical. Preferably, the core has a core index of refraction ($n_1$), and the cladding has a cladding index of refraction ($n_2$), wherein $n_1 > n_2$ or $n_1 = n_2$.

In some embodiments, the device could further comprise at least a pair of metal contacts with at least one of the metal contacts being contacted to the waveguide. Preferably, the optical pipe is configured to separate wavelengths of an electromagnetic radiation beam incident on the optical pipe at a selective wavelength through the core and the cladding without requiring a color or IR filter. Preferably, the waveguide is configured to convert energy of the electromagnetic radiation transmitted through the waveguide and to generate electron hole pairs (excitons). Preferably, the waveguide comprises a PIN junction that is configured to detect the excitons generated in the waveguide.

In some embodiments, the device could further comprise an insulator layer around the waveguide in the core and a metal layer around the insulator layer to form a capacitor that is configured to collect the excitons generated in the waveguide and store charge. The could device further comprise metal contacts that connect to the metal layer and waveguide to control and detect the charge stored in the capacitor. Preferably, the cladding is configured to be a channel to transmit the wavelengths of the electromagnetic radiation beam that do not transmit through the core. Preferably, the cladding comprises a passive waveguide.

In some embodiments, the device could further comprise a peripheral photosensitive element, wherein the peripheral photosensitive element is operably coupled to the cladding. Preferably, an electromagnetic radiation beam receiving end of the optical pipe comprises a curved surface. Preferably, the peripheral photosensitive element is located on or within a substrate. Preferably, the core and the cladding are located on a substrate comprising an electronic circuit.

In some embodiments, the device could further comprise a lens structure or an optical coupler over the optical pipe, wherein the optical coupler is operably coupled to the optical pipe. Preferably, the optical coupler comprises a curved surface to channel the electromagnetic radiation into the optical pipe.

In some embodiments, the device could further comprise a stack surrounding the optical pipe, the stack comprising metallic layers embedded in dielectric layers, wherein the dielectric layers have a lower refractive index than that of the cladding. Preferably, a surface of the stack comprises a reflective surface. Preferably, the core comprises a first waveguide and the cladding comprises a second waveguide.

Other embodiments relate to a compound light detector comprising at least two different devices, each device comprising a optical pipe comprising a core and a cladding, the optical pipe being configured to separate wavelengths of an electromagnetic radiation beam incident on the optical pipe at a selective wavelength through the core and the cladding, wherein the core is configured to be both a channel to transmit the wavelengths up to the selective wavelength and an active element to detect the wavelengths up to the selective wavelength transmitted through the core, and the compound light detector is configured to reconstruct a spectrum of wavelengths of the electromagnetic radiation beam. Preferably, the core comprises a first waveguide having the selective wavelength such that electromagnetic radiation of wavelengths beyond the selective wavelength transmits through the cladding, further wherein the selective wavelength of the core of each of the at least two different devices is different such that the at least two different devices separate the electromagnetic radiation beam incident on the compound light detector at different selective wavelengths. Preferably, the cladding comprises a second waveguide that permits electromagnetic radiation of wavelengths beyond the selective wavelength to remains within the cladding and be transmitted to a peripheral photosensitive element. Preferably, a cross-sectional area of the cladding at an electromagnetic radiation beam emitting end of the cladding is substantially equal to an area of the peripheral photosensitive element. The compound light detector could further comprise a stack of metallic and non-metallic layers surrounding the optical pipe.

Preferably, the compound light detector is configured to detect energies of the electromagnetic radiation of four different ranges of wavelengths wherein the energies of the electromagnetic radiation of the four different ranges of wavelengths are combined to construct red, green and blue colors.

Other embodiments relate to a compound light detector comprising at least a first device and a second device, wherein the first device is configured to provide a first separation of an electromagnetic radiation beam incident on the optical pipe at a first selective wavelength without any filter, the second device is configured to provide a second separation of the electromagnetic radiation beam incident on the optical pipe at a second selective wavelength without any filter, the first selective wavelength is different from the second selective wavelength, each of the first device and the second device comprises a core that is configured to be both a channel to transmit the wavelengths up to the selective wavelength and an active element to detect the wavelengths up to the selective wavelength transmitted through the core, and the compound light detector is configured to reconstruct a spectrum of wavelengths of the electromagnetic radiation beam. Preferably, the two different devices comprise cores of different diameters. Preferably, the spectrum of wavelengths comprises wavelengths of visible light, IR or combinations thereof. Preferably, the first device comprises a core of a different diameter than that of the second device and the spectrum of wavelengths comprises wavelengths of visible light, IR or combinations thereof.

Preferably, the first device comprises a first waveguide having the first selective wavelength such that electromagnetic radiation of wavelength beyond the first selective wavelength will not be confined by the first waveguide, wherein the second device comprises a second waveguide having the second selective wavelength such that electromagnetic radiation of wavelength beyond the second selective wavelength will not be confined by the second waveguide, further wherein the first selective wavelength is different from the second selective wavelength. Preferably, the first device further comprises a first waveguide that permits electromagnetic radiation of wavelength of greater than the first selective wavelength to remains within the first waveguide and the second device further comprises a second waveguide that permits electromagnetic radiation of wavelength of greater than the second selective wavelength to remains within the second waveguide. Preferably, each of the first and second devices comprises a cladding comprising a photosensitive element. The compound light detector could further comprise a stack of metallic and non-metallic layers surrounding the first and second devices. Preferably, the first device comprises a core of a different diameter than that of the second device and the spectrum of wavelengths comprises wavelengths of visible light. Preferably, a plurality of light detectors are arranged on a square lattice, an hexagonal lattice, or in a different lattice arrangement.

In yet other embodiments, the lens structure or the optical coupler comprises a first opening and a second opening with the first opening being larger than the second opening, and a connecting surface extending between the first and second openings. Preferably, the connecting surface comprises a reflective surface. In yet other embodiments, a plurality of light detectors are arranged on a regular tessellation.

Figure 2:
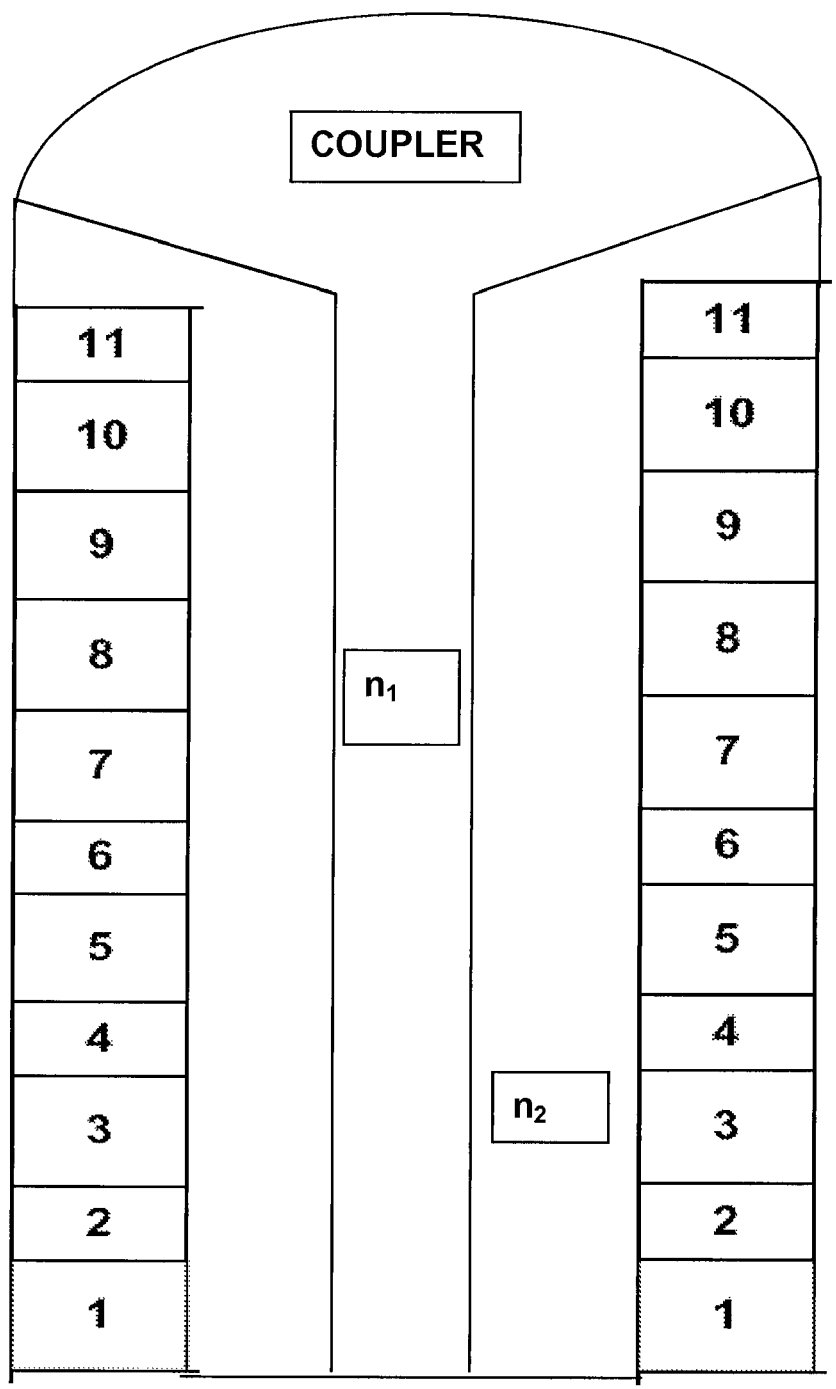
FIG. 2 shows a cross sectional view of an embodiment of an image sensor.

In yet other embodiments, as shown in FIG. 2, a coupler that may take the shape of a micro lens could be located on the optical pipe to collect and guide the electromagnetic radiation into the optical pipe. As shown in FIG. 2, the optical pipe comprises of a nanowire core of refractive index $n_1$ surrounded by a cladding of refractive index $n_2$.

In the configuration of the optical pipe of FIG. 2, it is possible to eliminate pigmented color filters that absorb about ⅔ of the light that impinges on the image sensor. The core functions as an active waveguide and the cladding of the optical pipe could function as a passive waveguide with a peripheral photosensitive element surrounding the core to detect the electromagnetic radiation transmitted through the passive waveguide of the cladding. Passive waveguides do not absorb light like color filters, but can be designed to selectively transmit selected wavelengths. Preferably, the cross sectional area of the end of the cladding of the optical pipe adjacent to the peripheral photosensitive element in or on the substrate below the cladding is about the same size as the area of the peripheral photosensitive element.

A waveguide, whether passive or active, has a cutoff wavelength that is the lowest frequency that the waveguide can propagate. The diameter of the semiconductor waveguide of the core serves as the control parameter for the cutoff wavelength of the waveguide. In some embodiments, the optical pipe could be circular in or cross section so as to function as a circular waveguide characterized by the following parameters: (1) the core radius ($R_c$); (2) the core index of refraction ($n_1$); and (3) the cladding index of refraction ($n_2$). These parameters generally determine the wavelength of light that can propagate through the waveguide. A waveguide has a cutoff wavelength, $\lambda_{ct}$. The portion of the incident electromagnetic radiation having wavelengths longer than the cutoff wavelength would not be confined with the core. As a result, an optical pipe that functions as a waveguide whose cutoff wavelength is at green will not propagate red light though the core, and an optical pipe that functions as a waveguide whose cutoff wavelength is at blue will not propagate red and green light through the core.

In one implementation, a blue waveguide and a cyan (blue/green) waveguide could be embedded within white waveguides, which could be in the cladding. Blue light could remain in the blue waveguide core, blue or green light could remain in the cyan (green/blue) waveguide of another core. The remainder of the light could remain in the white waveguides in one or more the claddings.

The core could also serve as a photodiode by absorbing the confined light and generating electron hole pairs (excitons). As a result, an active waveguide in the core whose cutoff wavelength is at green will not propagate red light but will also absorb the confined green light and generate excitons.

Excitons so generated can be detected by using at least one of the following two designs:
(1) A core is made up of a three layers, semiconductor, insulator and metal thus forming a capacitor to collect the charge generated by the light induced carriers. Contacts are made to the metal and to the semiconductor to control and detect the stored charge. The core could be formed by growing a nanowire and depositing an insulator layer and a metal layer surrounding the nanowire.
(2) A core having a PIN junction that induces a potential gradient in the core wire. The PIN junction in the core could be formed by growing a nanowire and doping the nanowire core while it is growing as a PIN junction and contacting it at the appropriate points using the various metal layers that are part of any device.

The photosensitive elements of the embodiments typically comprise a photodiode, although not limited to only a photodiode. Typically, the photodiode is doped to a concentration from about $1 \times 10^{16}$ to about $1 \times 10^{18}$ dopant atoms per cubic centimeter, while using an appropriate dopant.

The layers 1-11 in FIG. 2 illustrate different stacking layers similar to layers 1-11 of FIG. 1. The stacking layers comprise dielectric material-containing and metal-containing layers. The dielectric materials include as but not limited to oxides, nitrides and oxynitrides of silicon having a dielectric constant from about 4 to about 20, measured in vacuum. Also included, and also not limiting, are generally higher dielectric constant gate dielectric materials having a dielectric constant from about 20 to at least about 100. These higher dielectric constant dielectric materials may include, but are not limited to hafnium oxides, hafnium silicates, titanium oxides, barium-strontium titanates (BSTs) and lead-zirconate titanates (PZTs).

The dielectric material-containing layers may be formed using methods appropriate to their materials of composition. Non-limiting examples of methods include thermal or plasma oxidation or nitridation methods, chemical vapor deposition methods (including atomic layer chemical vapor deposition methods) and physical vapor deposition methods.

The metal-containing layers could function as electrodes. Non-limiting examples include certain metals, metal alloys, metal silicides and metal nitrides, as well as doped polysilicon materials (i.e., having a dopant concentration from about $1 \times 10^{18}$ to about $1 \times 10^{22}$ dopant atoms per cubic centimeter) and polycide (i.e., doped polysilicon/metal silicide stack) materials. The metal-containing layers may be deposited using any of several methods. Non-limiting examples include chemical vapor deposition methods (also including atomic layer chemical vapor deposition methods) and physical vapor deposition methods. The metal-containing layers could comprise a doped polysilicon material (having a thickness typically in the range 1000 to 1500 Angstrom The dielectric and metallization stack layer comprises a series of dielectric passivation layers. Also embedded within the stack layer are interconnected metallization layers. Components for the pair of interconnected metallization layers include, but are not limited to contact studs, interconnection layers, interconnection studs.

The individual metallization interconnection studs and metallization interconnection layers that could be used within the interconnected metallization layers may comprise any of several metallization materials that are conventional in the semiconductor fabrication art. Non-limiting examples include certain metals, metal alloys, metal nitrides and metal silicides. Most common are aluminum metallization materials and copper metallization materials, either of which often includes a barrier metallization material, as discussed in greater detail below. Types of metallization materials may differ as a function of size and location within a semiconductor structure. Smaller and lower-lying metallization features typically comprise copper containing conductor materials. Larger and upper-lying metallization features typically comprise aluminum containing conductor materials.

The series of dielectric passivation layers may also comprise any of several dielectric materials that are conventional in the semiconductor fabrication art. Included are generally higher dielectric constant dielectric materials having a dielectric constant from 4 to about 20. Non-limiting examples that are included within this group are oxides, nitrides and oxynitrides of silicon. For example, the series of dielectric layers may also comprise generally lower dielectric constant dielectric materials having a dielectric constant from about 2 to about 4. Included but not limiting within this group are hydrogels such as silicon hydrogel, aerogels like silicon Al, or carbon aerogel, silsesquioxane spin-on-glass dielectric materials, fluorinated glass materials, organic polymer materials, and other low dielectric constant materials such as doped silicon dioxide (e.g., doped with carbon, fluorine), and porous silicon dioxide.

Typically, the dielectric and metallization stack layer comprises interconnected metallization layers and discrete metallization layers comprising at least one of copper metallization materials and aluminum metallization materials. The dielectric and metallization stack layer also comprises dielectric passivation layers that also comprise at least one of the generally lower dielectric constant dielectric materials disclosed above. The dielectric and metallization stack layer could have an overall thickness from about 1 to about 4 microns. It may comprise from about 2 to about 4 discrete horizontal dielectric and metallization component layers within a stack.

The layers of the stack layer could be patterned to form patterned dielectric and metallization stack layer using methods and materials that are conventional in the semiconductor fabrication art, and appropriate to the materials from which are formed the series of dielectric passivation layers. The dielectric and metallization stack layer may not be patterned at a location that includes a metallization feature located completely therein. The dielectric and metallization stack layer may be patterned using wet chemical etch methods, dry plasma etch methods or aggregate methods thereof. Dry plasma etch methods as well as e-beam etching if the dimension needs to be very small, are generally preferred insofar as they provide enhanced sidewall profile control when forming the series of patterned dielectric and metallization stack layer.

The planarizing layer 11 may comprise any of several optically transparent planarizing materials. Non-limiting examples include spin-on-glass planarizing materials and organic polymer planarizing materials. The planarizing layer 11 could extend above the optical pipe such that the planarizing layer 11 would have a thickness sufficient to at least planarize the opening of the optical pipe, thus providing a planar surface for fabrication of additional structures within the CMOS image sensor. The planarizing layer could be patterned to form the patterned planarizing layer.

Optionally, there could be a series of color filter layers 12 located upon the patterned planarizing layer 11. The series of color filter layers, if present, would typically include either the primary colors of red, green and blue, or the complementary colors of yellow, cyan and magenta. The series of color filter layers would typically comprise a series of dyed or pigmented patterned photoresist layers that are intrinsically imaged to form the series of color filter layers. Alternatively, the series of color filter layers may comprise dyed or pigmented organic polymer materials that are otherwise optically transparent, but extrinsically imaged while using an appropriate mask layer. Alternative color filter materials may also be used. The filter could also be filter for a black and white, or IR sensors wherein the filter cuts off visible and pass IR predominantly.

The spacer layer (13) could be one or more layers made of any material that physically, but not optically, separates the stacking layers from the micro lens (14). The spacer layer could be formed of a dielectric spacer material or a laminate of dielectric spacer materials, although spacer layers formed of conductor materials are also known. Oxides, nitrides and oxynitrides of silicon are commonly used as dielectric spacer materials. Oxides, nitrides and oxynitrides of other elements are not excluded. The dielectric spacer materials may be deposited using methods analogous, equivalent or identical to the methods described above. The spacer layer could be formed using a blanket layer deposition and etchback method that provides the spacer layer with the characteristic inward pointed shape.

The micro lens (14) may comprise any of several optically transparent lens materials that are known in the art. Non-limiting examples include optically transparent inorganic materials, optically transparent organic materials and optically transparent composite materials. Most common are optically transparent organic materials. Typically the lens layers could be formed incident to patterning and reflow of an organic polymer material that has a glass transition temperature lower than the series of color filter layers 12, if present, or the patterned planarizing layer 11.

In the optical pipe, the high index material in the core could, for example, be silicon nitride having a refractive index of about 2.0. The lower index cladding layer material could, for example, be a glass, for example a material selected from Table II, having a refractive index about 1.5.

TABLE II

| Typical Material Index of Refraction | |
|---|---|
| Micro Lens (Polymer) | 1.583 |
| Spacer | 1.512 |
| Color Filter | 1.541 |
| Planarization | 1.512 |
| PESiN | 2.00 |
| PESiO | 1.46 |
| SiO | 1.46 |

In Table II, PESiN refers to plasma enhanced SiN and PESiO refers to plasma enhanced SiO.

Optionally, a micro lens could be located on the optical pipe near the incident electromagnetic radiation beam receiving end of the image sensor. The function of the micro lens or in more general terms is to be a coupler, i.e., to couple the incident electromagnetic radiation beam into the optical pipe. If one were to choose a micro lens as the coupler in this embodiment, its distance from the optical pipe would be much shorter than to the photosensitive element, so the constraints on its curvature are much less stringent, thereby making it implementable with existing fabrication technology.

The shape of the optical pipe could be different for different embodiments. In one configuration, the optical pipe could cylindrical, that is, the diameter of the pipe remains the substantially the same throughout the length of the optical pipe. In another configuration, the optical pipe could conical, where the upper diameter of the cross sectional area of the optical pipe could be greater or smaller than the lower diameter of the cross sectional area of the optical pipe. The terms "upper" and "lower" refer to the ends of the optical pipe located closer to the incident electromagnetic radiation beam receiving and exiting ends of the image sensor. Other shapes include a stack of conical sections.

Table II lists several different glasses and their refractive indices. These glasses could be used for the manufacture of the optical pipe such that refractive index of the core is higher than that of the cladding. The image sensors of the embodiments could be fabricated using different transparent glasses having different refractive indices without the use of pigmented color filters.

By nesting optical pipes that function as waveguides and using a micro lens coupler as shown in FIG. 2, an array of image sensors could be configured to obtain complementary colors having wavelengths of electromagnetic radiation separated at a cutoff wavelength in the core and cladding of each optical pipe of every image sensor. The complementary colors are generally two colors when mixed in the proper proportion produce a neutral color (grey, white, or black). This configuration also enables the capture and guiding of most of the electromagnetic radiation incident beam impinging on the micro lens to the photosensitive elements (i.e., photodiodes) located at the lower end of the optical pipe. Two adjacent or substantially adjacent image sensors with different color complementary separation can provide complete information to reconstruct a full color scene according to embodiments described herein. This technology of embodiments disclosed herein can further supplant pigment based color reconstruction for image sensing which suffers from the inefficiency of discarding (through absorption) the non selected color for each pixel.

Each physical pixel of a device containing an image sensor of the embodiments disclosed herein would have two outputs representing the complementary colors, e.g., blue (complement yellow) designated as output type 1 and cyan (complement red) designated as output type 2. These outputs would be arranged as follows:

1212121212121212 ...

2121212121212121 ...

1212121212121212 ...

...

...

Each physical pixel would have complete luminance information obtained by combining its two complementary outputs. As a result, the same image sensor can be used either as a full resolution black and white or full color sensor.

In the embodiments of the image sensors disclosed herein, the full spectrum of wavelengths of the incident electromagnetic radiation beam (e.g., the full color information of the incident light) could be obtained by the appropriate combination of two adjacent pixels either horizontally or vertically as opposed to 4 pixels for the conventional Bayer pattern.

Depending on minimum transistor sizes, each pixel containing an image sensor of the embodiments disclosed herein could be as small as 1 micron or less in pitch and yet have sufficient sensitivity. This could open the way for contact imaging of very small structures such as biological systems.

The embodiments, which include a plurality of embodiments of an image sensor, as well as methods for fabrication thereof, will be described in further detail within the context of the following description. The description is further understood within the context of the drawings described above. The drawings are for illustrative purposes and as such are not necessarily drawn to scale.

An embodiment comprises a sensor array of two different types of pixels, each different type of pixel having a core of a different diameter such that cores have diameters $d_1$ and $d_2$ for directing light of different wavelengths ($\lambda_B$ and $\lambda_R$). The two cores also serve as photodiodes to capture light of wavelengths $\lambda_B$ and $\lambda_R$. The claddings of the two image sensors serve for transmitting the light of wavelength $\lambda_{w-B}$ and $\lambda_{w-R}$. The light of wavelength $\lambda_{w-B}$ and $\lambda_{w-R}$ transmitted through the cladding is detected by the peripheral photosensitive elements surrounding the cores. Note that (w) refers to the wavelength of white light. Signals from the 4 photodiodes (two located in the cores and two located in or on the substrate surrounding the core) in the compound pixel are used to construct color.

The embodiments include a nanostructured photodiode (PD) according to the embodiments comprise a substrate and an upstanding nanowire protruding from the substrate. A pn-junction giving an active region to detect light may be present within the structure. The nanowire, a part of the nanowire, or a structure in connection with the nanowire, forms a waveguide directing and detecting at least a portion of the light that impinges on the device. In addition the waveguide doubles up as spectral filter that enables the determination of the color range of the impinging light.

The waveguiding properties of the optical pipe of the embodiments can be improved in different ways. The waveguide core has a first effective refractive index, $n_1$ (also referred as $n_w$ below), and the material in the cladding surrounding at least a portion of the waveguide has a second effective refractive index, $n_2$ (also referred as $n_c$ below), and by assuring that the first refractive index is larger than the second refractive index, $n_1 > n_2$, good wave-guiding properties are provided to the optical pipe. The waveguiding properties may be further improved by introducing optically active cladding layers on the waveguide core. The nanowire core is used as a waveguide, and also as a nanostructured PD which may also be an active capacitor. The nanostructured PD according to the embodiments is well suited for mass production, and the method described is scaleable for industrial use.

The nanowire technology offers possibilities in choices of materials and material combinations not possible in conventional bulk layer techniques. This is utilised in the nanostructured PD according to the embodiments to provide PDs detecting light in well defined wavelength regions not possible by conventional technique, for example blue, cyan or white. The design according to the embodiments allows for inclusions of heterostructures as well as areas of different doping within the nanowire, facilitating optimization of electrical and/or optical properties.

A nanostructured PD according to the embodiments comprises of an upstanding nanowire. For the purpose of this application an upstanding nanowire should be interpreted as a nanowire protruding from the substrate in some angle, the upstanding nanowire for example being grown from the substrate, preferably by as vapor-liquid-solid (VLS) grown nanowires. The angle with the substrate will typically be a result of the materials in the substrate and the nanowire, the surface of the substrate and growth conditions. By controlling these parameters it is possible to produce nanowires pointing in only one direction, for example vertical, or in a limited set of directions. For example nanowires and substrates of zinc-blende and diamond semiconductors composed of elements from columns III, V and IV of the periodic table, such nanowires can be grown in the [111] directions and then be grown in the normal direction to any {111} substrate surface. Other directions given as the angle between normal to the surface and the axial direction of the nanowire include 70,53° {111}, 54,73° {100}, and 35,27° and 90°, both to {110}. Thus the nanowires define one, or a limited set, of directions.

According to the embodiments, a part of the nanowire or structure formed from the nanowire is used as a waveguide directing and confining at least a portion of the light impinging on the nanostructured PD in a direction given by the upstanding nanowire. The ideal waveguiding nanostructured PD structure includes a high refractive index core with one or more surrounding cladding with refractive indices less than that of the core. The structure is either circular symmetrical or close to being circular symmetrical. Light waveguiding in circular symmetrical structures are well know for fiber-optic applications and many parallels can be made to the area of rare-earth-doped fiber optic devices. However, one difference is that fiber amplifier are optically pumped to enhance the light guided through them while the described nanostructured PD can be seen as an efficient light to electricity converter. One well known figure of merit is the so called Numerical Aperture, NA. The NA determines the angle of light captured by the waveguide. The NA and angle of captured light is an important parameter in the optimization of a new PD structure.

For a PD operating in IR and above IR, using GaAs is good, but for a PD operating in the visible light region, silicon would be preferable. For example to create circuits, Si and doped Si materials are preferable. Similarly, for a PD working in the visible range of light, one would prefer to use Si.

In one embodiment, the typical values of the refractive indexes for III-V semiconductor core material are in the range from 2.5 to 5.5 when combined with glass type of cladding material (such as $SiO_2$ or $Si_3N_4$) having refractive indexes ranging from 1.4 to 2.3. A larger angle of capture means light impinging at larger angles can be coupled into the waveguide for better capture efficiency.

One consideration in the optimization of light capture is to provide a coupler into the nanowire structure to optimize light capture into the structure. In general, it would be preferred to have the NA be highest where the light collection takes place. This would maximize the light captured and guided into the PD.

A nanostructured PD according to the embodiments is schematically illustrated in FIG. 2 and comprises a substrate and a nanowire epitaxially grown from the substrate in an defined angle θ. A portion of or all of the nanowire could be arranged to act as a waveguiding portion directing at least a portion of the impinging light in a direction given by the elongated direction of the nanowire, and will be referred to as a waveguide. In one possible implementatioin, a pn-junction necessary for the diode functionality is formed by varying the doping of the wire along its length while it is growing. Two contact could be provided on the nanowire for example one on top or in a wrapping configuration on the circumferential outer surface (depicted) and the other contact could be provided in the substrate. The substrate and part of the upstanding structure may be covered by a cover layer, for example as a thin film as illustrated or as material filling the space surrounding the nanostructured PD.

The nanowire typically has a diameter in the order of 50 nm to 500 nm, The length of the nanowire is typically and preferably in the order of 1 to 10 μm. The pn-junction results in an active region arranged in the nanowire. Impinging photons in the nanowire are converted to electron hole pairs and in one implementation are subsequently separated by the electric fields generated by the PN junction along the length of the nanowire. The materials of the different members of the nanostructured PD are chosen so that the nanowire will have good waveguiding properties vis-a-vis the surrounding materials, i.e. the refractive index of the material in the nanowire should preferably be larger than the refractive indices of the surrounding materials.

In addition, the nanowire may be provided with one or more layers. A first layer, may be introduced to improve the surface properties (i.e., reduce charge leakage) of the nanowire. Further layers, for example an optical layer may be introduced specifically to improve the waveguiding properties of the nanowire, in manners similar to what is well established in the area of fiber optics. The optical layer typically has a refractive index in between the refractive index of the nanowire and the surrounding cladding region material. Alternatively the intermediate layer has a graded refractive index, which has been shown to improve light transmission in certain cases. If an optical layer is utilised the refractive index of the nanowire, $n_w$, should define an effective refractive index for both the nanowire and the layers.

The ability to grow nanowires with well defined diameters, as described above and exemplified below, is in one embodiment utilised to optimize the waveguiding properties of the nanowire or at least the waveguide with regards to the wavelength of the light confined and converted by the nanostructured PD. In the embodiment, the diameter of the nanowire is chosen so as to have a favorable correspondence to the wavelength of the desired light. Preferably the dimensions of the nanowire are such that a uniform optical cavity, optimized for the specific wavelength of the produced light, is provided along the nanowire. The core nanowire must be sufficiently wide to capture the desired light. A rule of thumb would be that diameter must be larger than $\lambda/2n_w$, wherein $\lambda$ is the wavelength of the desired light and $n_w$ is the refractive index of the nanowire. As an example a diameter of about 60 nm may be appropriate to confine blue light only and one 80 nm may be appropriate for to confine both blue and green light only in a silicon nanowire.

In the infra-red and near infra-red, a diameter above 100 nm would be sufficient. An approximate preferred upper limit for the diameter of the nanowire is given by the growth constrains, and is in the order of 500 nm. The length of the nanowire is typically and preferably in the order of 1-10 μm, providing enough volume for the light conversion region A reflective layer is in one embodiment, provided on the substrate and extending under the wire. The purpose of the reflective layer is to reflect light that is guided by the wire but has not been absorbed and converted to carriers in the nanostructured PD. The reflective layer is preferably provided in the form of a multilayered structure comprising repeated layers of silicates for example, or as a metal film. If the diameter of the nanowire is sufficiently smaller than the wavelength of the light a large fraction of the directed light mode will extend outside the waveguide, enabling efficient reflection by a reflective layer surrounding the narrow the nanowire waveguide An alternative approach to getting a reflection in the lower end of the waveguide core is to arrange a reflective layer in the substrate underneath the nanowire. Yet another alternative is to introduce reflective means within the waveguide. Such reflective means can be a multilayered structure provided during the growth process of the nanowire, the multilayered structure comprising repeated layers of for example $SiN_x/SiO_x$ (dielectric).

The previous depicted cylindrical volume element which is achievable with the referred methods of growing nanowires, should be seen as an exemplary shape. Other geometries that are plausible include, but is not limited to a cylindrical bulb with a dome-shaped top, a spherical/ellipsoidal, and pyramidal.

Preferably, the color response of a color light sensor is closely matched to the color response of the human eye. In one embodiment, the first step to optimize the diameter of a nanowire photodetector is to align the response of the nanowire of a desired wavelength with the corresponding response curves of the human eye using computer simulation. For example, the response of a nanowire with a desired blue and green response may be aligned to the blue and green response curves of the human eye. By closely matching the response of the photodiodes of the color light sensor to the response of the human eye, problems such as matamerism (when tow color samples appear to match under a particular light source and then do not match under a different light source) and loss of color fidelity under varying light illumination can be reduced or essentially eliminated.

One embodiment includes two different nanowire sensors or pixels. Preferably, the first nanowire sensor includes a light pipe with a core configured to channel blue light. Preferably, the core of the first nanowire sensor is surrounded with a cladding configured to channel light of the complementary color of the core. In the case of a core channeling blue light, the cladding preferably channels yellow light. Preferably, the second nanowire sensor includes a light pipe with a core configured to channel cyan light. Preferably, the core of the second nanowire sensor is surrounded with a cladding configured to channel light of the complementary color to the second core. In the case of a core channeling cyan light, the cladding preferably channels red light. The degree to which a linear combination of the spectral response of the blue and cyan nanowires and their complementary responses fit the eye response curves determines the color reproduction capability of the image sensor.

Numerous standard response curves of the human eye are known. In some embodiments, the Smith-Pokorny human eye response curves (shown in FIG. 5) could be used for the determination of an error difference between the spectral response of the image sensor of the claimed invention and the Smith-Pokorny human eye response curves. The Smith-Pokorny human eye response curves are linear combinations of the Commission Internationale d'Eclairage (CIE) eye response curves. The Smith-Pokorny human eye response curves are not only standard, but have the added benefit of having positive response at all points of the visible spectrum. Other standard response curves, however, may be used. Other standard response curves include, but are not limited to, CIE RGB, CIE, XYZ, CIE Lab, CIE UVW, and CIE Luv. In the CIE Luv system, u and v are chromaticity coordinates (or chrominance) and L is the luminance.

In one embodiment, the optimal diameters of the cores of the nanowire sensors are determined by computer simulation. In this embodiment, two different nanowire sensors are used. The diameters of the nanowire cores of the first and second nanowire sensors are preselected along with the materials of the nanowire cores and claddings. Based on the material properties of the cores and the claddings and any optional features of the sensor (e.g. reflective layer surrounding the light pipe, reflective layer on the substrate, etc.), a simulation is run to determine the spectral characteristics of the nanowire sensors. Preferably, the simulation includes the effect of crosstalk. The spectral response of the nanowire sensors are then compared to standard spectral response curves to determine the difference, or error between the nanowire sensors and the standard spectral response curves.

In one aspect, the computer simulation was run with Full-WAVE™ software from RSOFT Design Group. Full-WAVE™ is a Finite Difference Time Domain (FDTD) Maxwell's Equations solver. Results of this aspect are illustrated in FIGS. 7 and 8.

Figure 7:
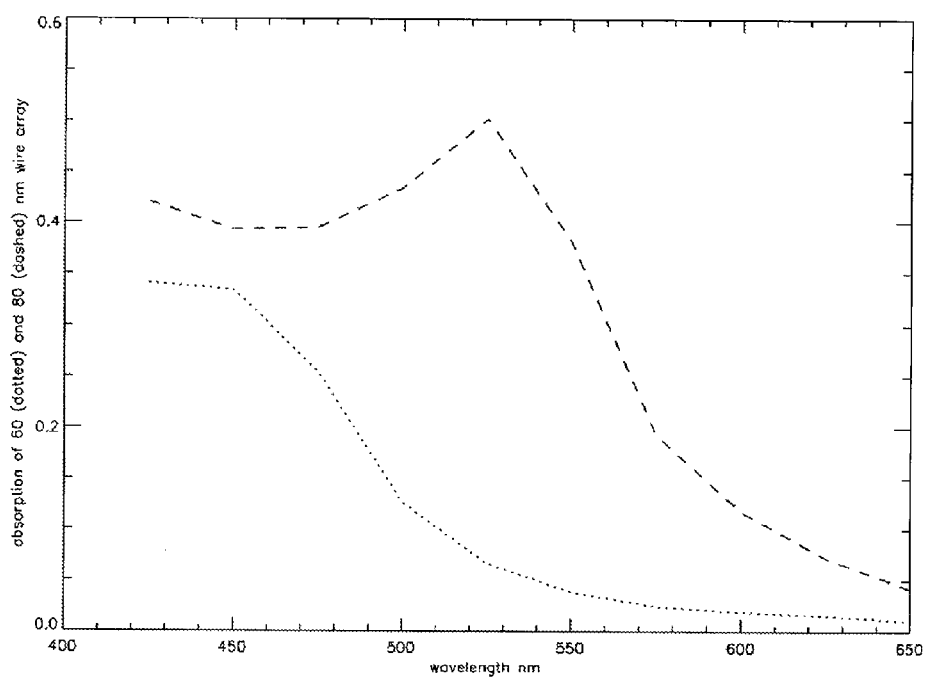
FIG. 7 illustrates a simulation of the absorption of a 60 nm wire and a 80 nm wire.

FIG. 7 illustrates the results of a simulation of the absorption of a 60 nm nanowire and a 80 nm nanowire. As can be seen from FIG. 7, in the case of Si, the 60 nm nanowire primarily absorbs blue light (approximately 450-500 nm), allowing light of higher wavelengths to leak out of the nanowire. The 80 nm nanowire absorbs primarily blue light (approximately 450-500 nm) and green light (approximately 500-570 nm), allowing light of higher wavelengths to leak out of the nanowire. Thus, the 60 nm nanowire primarily retains only blue light while allowing the compliment, yellow light, to leak out. The 80 nm nanowire primarily retains only blue and green (cyan) light while allowing its compliment, red light, to leak out. Note, both the 60 nm nanowire and the 80 nm nanowire absorb some higher (orange/red) wavelength light. This is due to spectral crosstalk as discussed above.

Figure 8:
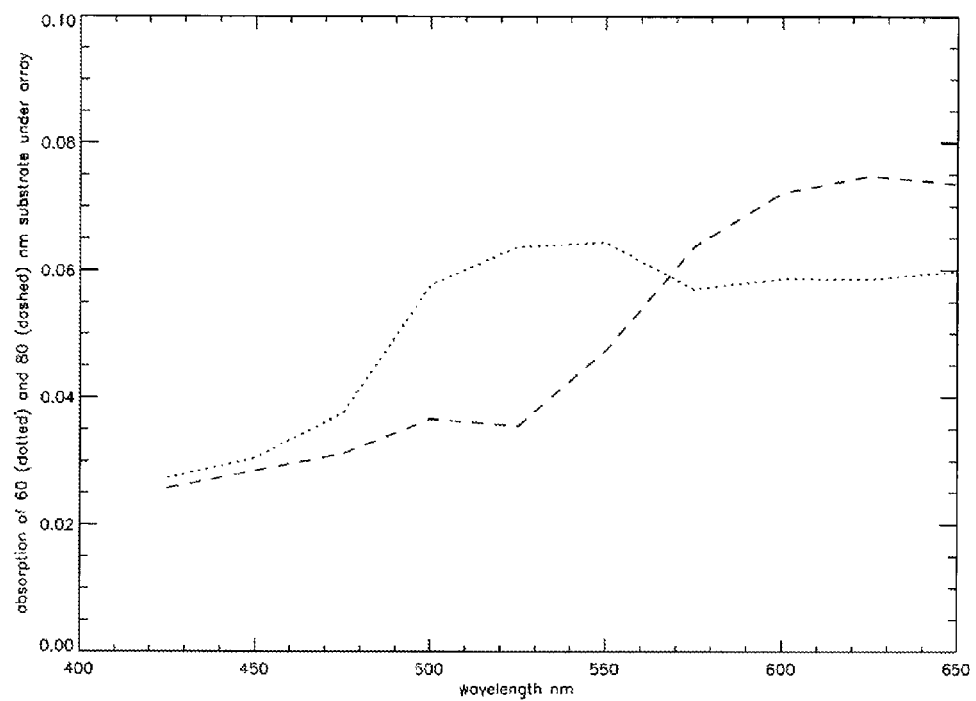
FIG. 8 illustrates a simulation of the absorption the substrates of a 60 nm wire and a 80 nm wire device.

FIG. 8 illustrates the results of a simulation of the absorption of the substrates of a 60 nm nanowire device and a 80 nm nanowire device. That is, FIG. 8 illustrates the results of the light that leaks out of the 60 nm nanowire and 80 nanowire illustrated in FIG. 7. As can be seen in FIG. 8, the absorption is low for both the 60 nm nanowire substrate and the 80 nm nanowire substrate. That is, essentially all of the light that leaks out of the 60 nm nanowire and 80 nm nanowire reaches the substrate. Note, both the 60 nm nanowire substrate and the 80 nm nanowire substrate absorb some lower (blue/green) wavelength light. This is due to spectral crosstalk as discussed above.

Figure 5:
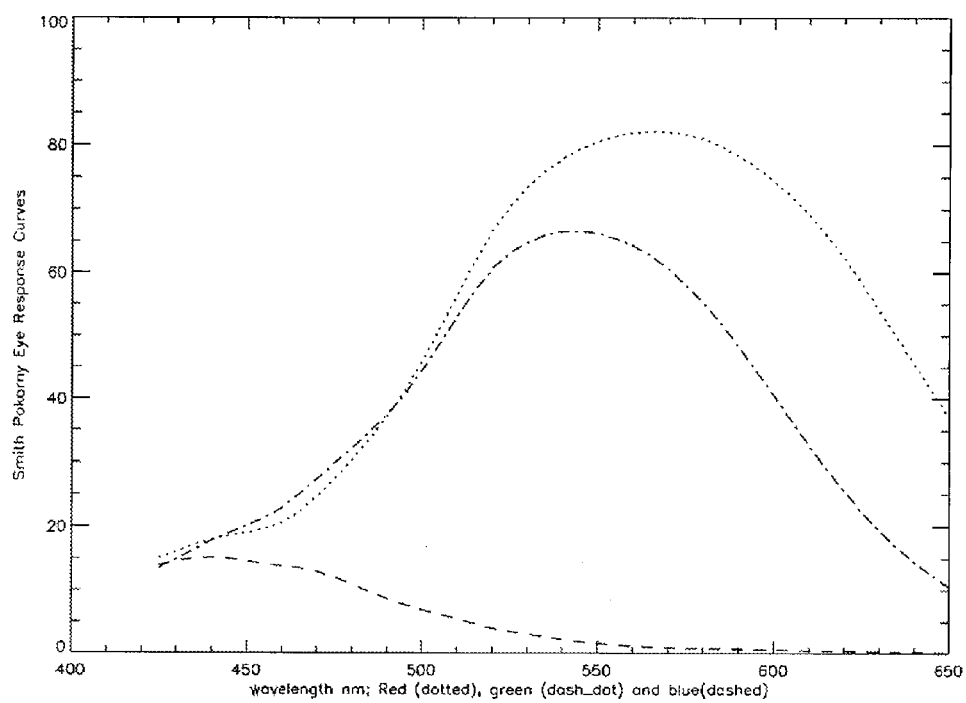
FIG. 5 is a plot of the Smith-Pokorny standard spectral response curves.
Figure 6:
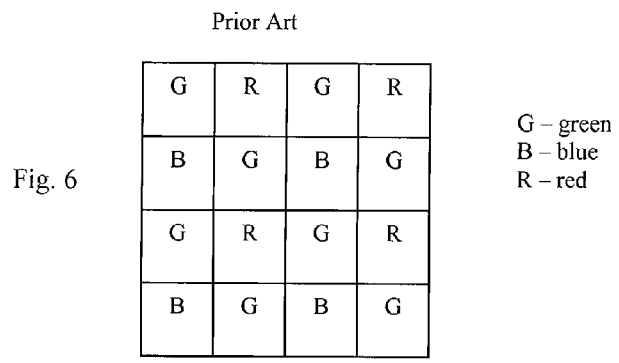
FIG. 6 is a schematic illustration of a conventional Bayer color scheme.

In one embodiment, the standard spectral response curves used are Smith-Pokorny eye response spectral curves (illustrated in FIG. 5). In the following example (illustrated in FIG. 3), the first nanowire sensor include a blue core with a complementary yellow cladding. The second nanowire sensor include a cyan core with a complementary red cladding. If Rsp, Gsp, and Bsp are the Smith-Pokorny eye response spectral curves for red, green, and blue respectively, the error can be calculated from the following equations:

$$Rsp = Ayr*Ynw + Abr*Bnw + Arr*Rnw + Acr*Cnw,$$

$$Gsp = Ayg*Ynw + Abg*Bnw + Arg*Rnw + Acg*Cnw,$$

$$Bsp = Ayb*Ynw + Abb*Bnw + Arb*Rnw + Acb*Cnw,$$

where Ynw and Bnw are the spectral responses of the first nanowire, Rnw and Cnw are the spectral responses of the second nanowire, and Ayr, Abr, Arr, Acr, Ayg, Abg, Arg, Acg, Ayb, Abb, Arb, Acb are constants. The value of the constants Axx are determined such that the above equations are satisfied with the least error. The spectral error of the device can then be determined by taking a least square fit of the error between the best fit spectral response curves of the nanowire sensor devices and the Smith-Pokorny eye response spectral curves. In alternative embodiments, the spectral error of the device can be determined by other regression or curve fitting techniques, such as least square parabola and least square $m^{th}$ degree polynomial. After the spectral error of the device is calculated, new diameters may be selected for the first and second nanowire devices and the process repeated until the above equations are satisfied with the least error, thereby identifying the nanowire diameters resulting to the lowest total error from the standard Smith-Pokorny eye response spectral curves.

In alternative embodiments, rather than a simulation, actual devices are fabricated and the actual spectral responses measured. The spectral errors between the actual device and a standard spectral response curve are determined. In this way, the diameter of the nanowire sensor devices can be optimized with actual nanowire sensor devices.

Other embodiments relate to scene reconstruction based on digitized responses taken with nanowire sensor devices. Each pair of pixels has complete luminance information obtained by combining its two complementary outputs. As a result, the same image sensor can be used either as a full resolution black and white or full color sensor. Further, the color reconstruction could be done to obtain full color information by the appropriate combination of two adjacent pixels. The pixels may be either horizontally or vertically adjacent. Further, because all the information can be obtained with two adjacent pixels, the reconstruction method of the present embodiment is more efficient and may be faster than the 4 pixel method required by the Bayer pattern of convention image sensors.

Figure 3:
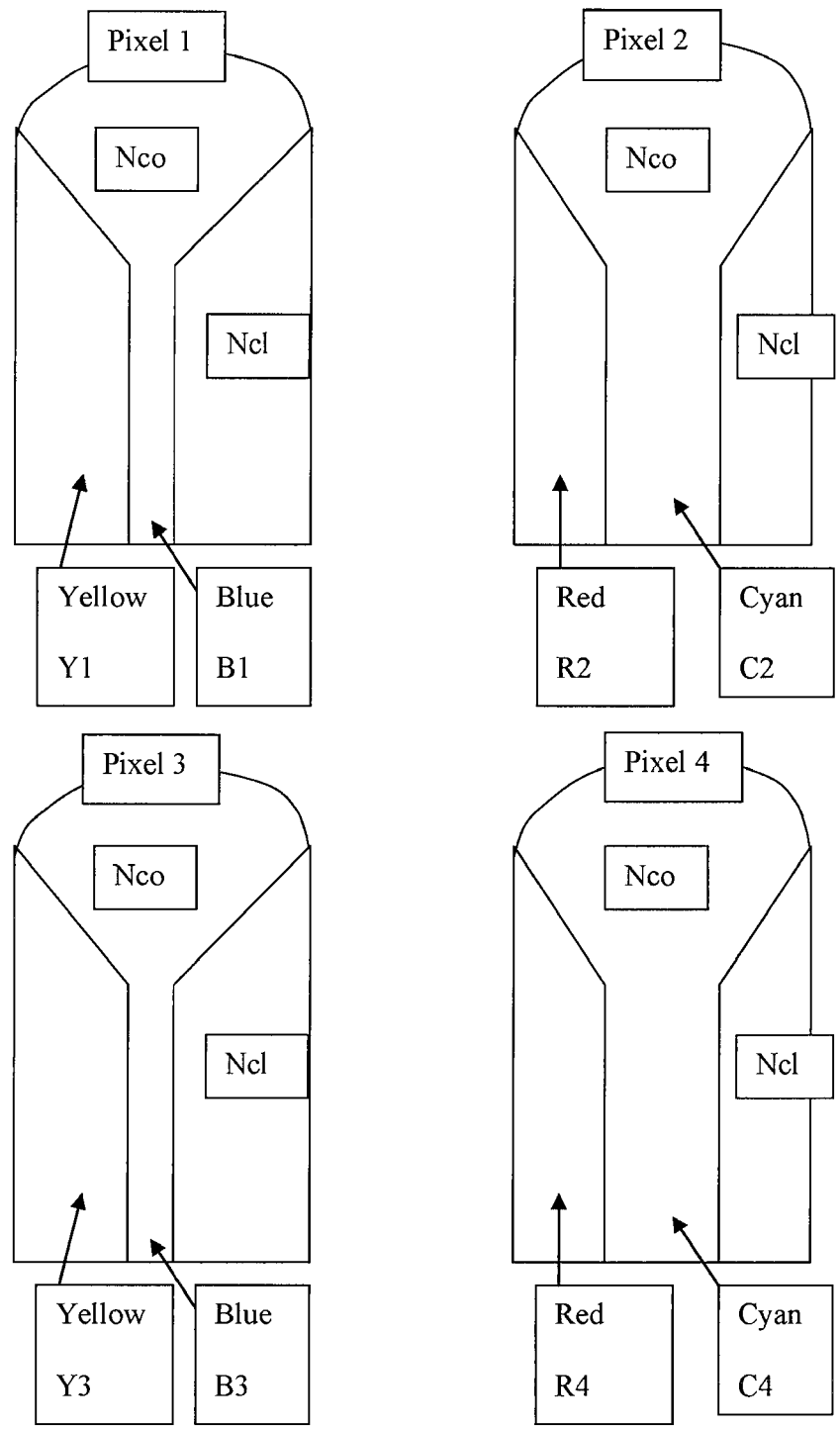
FIG. 3 shows a portion of an array of image sensors

In a first scene reconstruction method embodiment, digitized responses are received from a sensor array comprising alternating pixels of nanowire photodiodes. In the following example, the reconstruction method is based on the photodiode sensor array illustrated in FIG. 3. In FIG. 3, the array has been illustrated as a 2×2 matrix. However, the four nanowire photodiodes may be configured in the same row. Indeed, for the following explanation of the method of this embodiment, it will be assumed that the four nanowire photodiodes are in the same row.

In this embodiment, the first and third nanowire photodiodes (pixels 1 and 3) have a blue core and a yellow cladding. The second and fourth nanowire photodiodes (pixels 2 and 4) have a cyan core and a red cladding. In this embodiment, the scene is reconstructed by taking the digitized responses of two adjacent pixels at a time and transforming the digitized responses of the two adjacent pixels to determine the red, green, and blue color of the scene. The transformation is performed with the use of color matching functions, the use of which are well known in the art. Color matching functions are a numerical description of the chromatic response of the observer. By applying the appropriate color matching function, the yellow, blue, cyan, and red outputs of adjacent pixels can be mathematically transformed to the red, blue and green response of the standard observer.

In this embodiment, the transformation is performed by stepping across a row one pixel at a time. That is, first the color data from pixels 1 and 2 are transformed, then 2 and 3, then 3 and 4, and so on until the end of the row is reached. After transformation of the first row is completed, the next row is transformed in a similar manner and so on, until the entire scene or image is reconstructed.

Because a single row of pixels can be transformed by stepping across the row, there is no need to buffer an entire row of pixels as is necessary to transform conventional Bayer configured color sensors (discussed above). Thus, the present embodiment can be transformed more quickly and more efficiently than a conventional Bayer configured color sensor.

The first scene reconstruction method embodiment can be performed with the following equations for the first pair of pixels (pixels 1 and 2):

$$R1 = Ayr*Y1 + Abr*B1 + Arr*R2 + Acr*C2,$$

$$G1 = Ayg*Y1 + Abg*B1 + Arg*R2 + Acg*C2,$$

$$B1 = Ayb*Y1 + Abb*B1 + Arb*R2 + Acb*C2,$$

where Y1 and B1 are spectral responses of the first yellow/blue nanowire photodiode device (pixel 1), R2 and C2 are spectral responses of the second red/cyan nanowire photodiode device (pixel 2), and Ayr, Abr, An, Acr, Ayg, Abg, Arg, Acg, Ayb, Abb, Arb, Acb are constants. For the second pair of pixels (pixels 2 and 3), the following equations may be used:

$$R2 = Ayr*Y3 + Abr*B3 + Arr*R2 + Acr*C2,$$

$$G2 = Ayg*Y3 + Abg*B3 + Arg*R2 + Acg*C2,$$

$$B2 = Ayb*Y3 + Abb*B3 + Arb*R2 + Acb*C2,$$

Where Y3 and B3 are spectral responses of the third yellow/blue nanowire photodiode device (pixel 3), R2 and C2 are the spectral response of the second red/cyan nanowire photodiode device (pixel 2), and Ayr, Abr, An, Acr, Ayg, Abg, Arg, Acg, Ayb, Abb, Arb, Acb are constants. The remaining pixels in the sensor array are transformed by stepping across the row one pixel at a time and solving equations as above.

In a second scene reconstruction method embodiment, digitized responses are also received from a sensor array comprising alternating pixels of nanowire photodiodes. In this embodiment (array in FIG. 3), the first and third nanowire photodiodes (pixels 1 and 3) have a blue core and a yellow cladding. The second and fourth nanowire photodiodes (pixels 2 and 4) have a cyan core and a red cladding. In this embodiment, the scene is reconstructed by taking the digitized responses of two adjacent pixels at a time and transforming the digitized responses to determine the luminance and the chrominance of the scene. In this embodiment, the transformation is performed by stepping across a row two pixels at a time. That is, first pixels 1 and 2 are transformed, then 3 and 4, then 5 and 6, and so on until the end of the row is reached. After the first row is completed, the next row is transformed in a similar manner. Because, as in the first scene reconstruction method embodiment, a single row pixels can be transformed by stepping across the row, there is no need to buffer an entire row as is necessary with conventional Bayer configured color sensors. Thus, the second scene reconstruction method embodiment also can be transformed more quickly and more efficiently than a conventional Bayer configured color sensor.

The transformation via the second scene reconstruction method embodiment can be performed with the equations below, illustrated for the first pair of pixels (pixels 1 and 2). In this example, the transformation is performed using the CIE Luv transformation which include a luminance value (L) and two chromance coordinates (u, v) to fully describe the color.

$$Luminance1 = Ly*Y1 + Lb*B1,$$

$$Luminance2 = Lr*R2 + Lc*C2,$$

$$Chrominance1 = Ayu*Y1 + Abu*B1 + Aru*R2 + Acu*C2,$$

$$Chrominance2 = Ayv*Y1 + Abv*B1 + Arv*R2 + Acv*C2,$$

Where Y1, B1 and R2, C2 are the spectral responses of the first and second nanowire photodiode devices, respectively, and Ly, Lb, Lr, Lc, Ayu, Ayv, Abu, Abv, Aru, Arv, Acu, and Acv are constants. The remaining pixels in the array are transformed in a similar manner. In the above scene reconstruction methods, the data is transformed one row at a time. In alternative embodiments, the nanowire color sensor is configured so that more than one row can be transformed at the same time. This may be accomplished, for example, with the addition of processing circuitry. In still another embodiment, the transformation may be performed in an interlaced fashion. In an alternative embodiment, the data can be subsampled. Because the human visual system is less sensitive to the position and motion of color than the luminance, bandwidth can be optimized by storing more luminance detail than color detail. Subsampling can be done, for example, with 4:2:2 subsampling. With 4:2:2 subsampling, the two chrominance components are sampled at half the sample rate of luminance. Thus, the horizontal chrominance resolution is halved. This reduces the bandwidth of a video signal by one-third with little to no visual difference. The output data stream in the 4:2:2 format is of the form:

Luminance1, Chrominance1, Luminance2, Chrominance2, . . . . Other subsampling formats include, but are not limited to, 4:2:1, 4:1:1, and 4:2:0.

Figure 4:
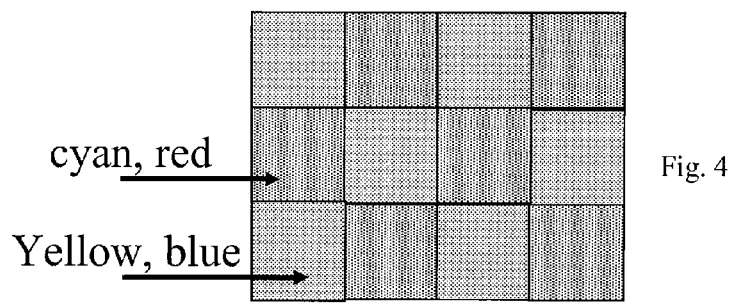
FIG. 4 shows a schematic of a top view of a device containing image sensors of the embodiments disclosed herein, each image sensor having two outputs representing the complementary colors.

FIG. 4 is a schematic illustration of a sensor according to an embodiment. Each physical pixel of a device containing an image sensor of the embodiments disclosed herein would have two outputs representing the complementary colors, e.g., cyan, red (C, R) designated as output type 1 or yellow, blue (Y, B) designated as output type 2 as shown in FIG. 4. These four outputs of two pixels can be resolved to reconstruct a full color scene of an image viewed by a device containing the image sensors of the embodiments described herein.

Another embodiment relates to a computer readable medium comprising computer executable instructions for simulating nanowire photodiode (pixel) devices. With this embodiment, the diameters of nanowires of the nanowire photodiodes (pixels) can be optimized to minimize the error difference in spectral response between the nanowire photodiodes and the spectral response of the human eye. The spectral response of the human eye may be represented with standard eye response curves such as the CIE curves or the Smith-Pokorny eye response spectral curves. The minimum or least error difference may be determined with the use of a least squares analysis. The simulation may take into account the effect of crosstalk.

In one embodiment, the cladding could be absent such that the complementary color is detected by the photodiode on the substrate.

The foregoing detailed description has set forth various embodiments of the devices and/or processes via the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to optical coupling to permit transmission of optical light, for example via an optical pipe or fiber, physically interacting components and/or wirelessly, interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method comprising:
providing or obtaining at least a first nanowire device comprising at least a first pixel and a second pixel, wherein the first pixel comprises a first nanowire comprising a predetermined material and a first diameter, the first pixel configured to detect a first predetermined color, and the second pixel comprises a second nanowire comprising a second predetermined material and a second diameter, the second pixel configured to detect a second predetermined color;
determining a first error difference between a first predetermined color spectral response of the first predetermined color of the first nanowire and one or more standard spectral response curves;
determining a second error difference between a second predetermined color spectral response of the second predetermined color of the second nanowire and the one or more standard spectral response curves; and
determining a total error difference of the first nanowire device at least from the first and second error differences.

2. The method of claim 1, further comprising:
determining the first and second diameters that produce the a least value of the total error difference.

3. The method of claim 1, wherein the standard spectral response curves are Smith-Pokorny eye response spectral curves.

4. The method of claim 3, wherein the first pixel is configured to detect blue and yellow and the second pixel is configured to detect cyan and red and determining the first, second, third, and fourth error differences between the spectral responses of the first and second nanowires and the Smith-Pokorny eye response spectral curves comprises determining the constants in the following equations:

$$Rsp=Ayr*Ynw+Abr*Bnw+Arr*Rnw+Acr*Cnw,$$

$$Gsp=Ayg*Ynw+Abg*Bnw+Arg*Rnw+Acg*Cnw,$$

$$Bsp=Ayb*Ynw+Abb*Bnw+Arb*Rnw+Acb*Cnw,$$

where Rsp, Gsp, and Bsp are the Smith-Pokorny eye response spectral curves, Ynw (yellow), Bnw (blue) and Rnw (red), Cnw (cyan) are the spectral responses of the first and second nanowires, respectively, and Ayr, Abr, Arr, Acr, Ayg, Abg, Arg, Acg, Ayb, Abb, Arb, and Acb are constants.

5. The method of claim 1, wherein the standard spectral response curves are CIE standard observer curves.

6. The method of claim 1, wherein the total least error difference is determined with a least squares analysis.

7. The method of claim 1, wherein the first pixel is configured to detect blue and yellow and the second pixel is configured to detect cyan and red.

8. The method of claim 1, wherein the first nanowire device comprises an optical pipe comprising a core and a cladding, wherein the core is configured to transmit light with wavelengths up to the predetermined color.

9. The method of claim 1, wherein the first nanowire has a diameter of approximately 60 nm and the second nanometer has a diameter of approximately 80 nm.

10. The method of claim 1, further comprising fabricating a sensor array having a plurality of first and second pixels.

11. The method of claim 10, wherein the sensor array comprises rows and columns of alternating first and second pixels.

12. A tangible computer readable medium comprising computer executable instructions for the method of claim 1.

13. The method of claim 1, further comprising:
providing a plurality of additional nanowire devices, each of the additional nanowire devices comprising at least an additional first pixel and an additional second pixel, wherein each of the additional first pixels comprises an additional first nanowire comprising the same predetermined material as the first nanowire but having a different diameter from each of the other additional first nanowires and from the first nanowire and each of the additional second pixels comprise an additional second nanowire comprising the same predetermined material as the second nanowire but having a different diameter from each other second additional nanowires and from the second nanowire;
determining total error differences of the additional nanowire devices.

14. A method comprising:
receiving digitized responses of an array of nanowire photodiode devices, the array comprising an alternating plurality of first nanowire photodiode devices and second nanowire photodiode devices, the first nanowire photodiode devices configured to detect a first color and the second nanowire photodiode devices configured to detect a second color; and transforming the digitized responses by stepping across a row of alternating first and second nanowire photodiode devices and successively calculating the red, green, and blue scene color from a pair of adjacent first and second nanowire photodiode devices, wherein stepping across the row is performed one nanowire photodiode device at a time.

15. The method of claim 14, wherein transforming the digitized responses comprises calculating the red, green, and blue scene color with the following equations for a first yellow/blue nanowire photodiode device adjacent to a second red/cyan nanowire photodiode device:

$$R1 = Ayr*Y1 + Abr*B1 + Arr*R2 + Acr*C2,$$

$$G1 = Ayg*Y1 + Abg*B1 + Arg*R2 + Acg*C2,$$

$$B1 = Ayb*Y1 + Abb*B1 + Arb*R2 + Acb*C2,$$

where Y1, B1 and R2, C2, are spectral responses of the first yellow/blue nanowire photodiode device and the second red/cyan nanowire photodiode device, respectively, and Ayr, Abr, Arr, Acr, Ayg, Abg, Arg, Acg, Ayb, Abb, Arb, and Acb are constants.

16. The method of claim 15, wherein transforming the digitized responses comprises calculating the red, green, and blue scene color with the following equations for a third yellow/blue nanowire photodiode device adjacent to the second red/cyan nanowire photodiode device:

$$R2 = Ayr*Y3 + Abr*B3 + Arr*R2 + Acr*C2,$$

$$G2 = Ayg*Y3 + Abg*B3 + Arg*R2 + Acg*C2,$$

$$B2 = Ayb*Y3 + Abb*B3 + Arb*R2 + Acb*C2,$$

Where Y3, B3 and R2, C2 are spectral responses of the third yellow/blue nanowire photodiode device and the second red/cyan nanowire photodiode device, respectively, and Ayr, Abr, Arr, Acr, Ayg, Abg, Arg, Acg, Ayb, Abb, Arb, and Acb are constants.

17. A tangible computer readable medium comprising computer executable instructions for the method of claim 14.

18. A method comprising receiving digitized responses of an array of nanowire photodiode devices, the array comprising an alternating plurality of first nanowire photodiode devices and second nanowire photodiode devices, the first nanowire photodiode devices configured to detect a first color and the second nanowire photodiode devices configured to detect a second color; and transforming the digitized responses by stepping across a row of alternating first and second nanowire photodiode devices and successively calculating the luminance and chrominance of the scene from a pair of adjacent first and second nanowire photodiode devices, wherein stepping across a row is performed a pair of nanodiodes devices at a time.

19. The method of claim 18, wherein transforming the digitized responses comprises calculating the luminance and chrominance of the scene with the following equations for a first yellow/blue nanowire photodiode device adjacent to a first red/cyan nanowire photodiode device:

$$\text{Luminance1} = Ly*Y1 + Lb*B1,$$

$$\text{Luminance2} = Lr*R2 + Lc*C2,$$

$$\text{Chrominance1} = Ayu*Y1 + Abu*B1 + Aru*R2 + Acu*C2,$$

$$\text{Chrominance2} = Ayv*Y1 + Abv*B1 + Arv*R2 + Acv*C2,$$

where Y1, B1 and R2, C2 are the spectral responses of the first and second nanowire photodiode devices, respectively, and Ly, Lb, Lr, Lc, Ayu, Ayv, Abu, Abv, Aru, Arv, Acu, and Acv are constants.

20. The method of claim 18, further comprising using a 4:2:2 subsampling.

21. A tangible computer readable medium comprising computer executable instructions for the method of claim 18.

22. A device comprising at least a first pixel and a second pixel, wherein the first pixel comprises a first nanowire comprising a predetermined material and a predetermined diameter, the first pixel configured to detect a first predetermined color and the second pixel comprises a second nanowire comprising a second predetermined material and a second predetermined diameter, the second pixel configured to detect a second predetermined color, wherein the first nanowire and the second nanowire have diameters which were determined to produce the least total error difference between spectral responses of the first and second pixels with standard spectral response curves.

23. The device of claim 22, wherein the device is an optical sensor.

24. The device of claim 22, wherein the standard spectral response curves are Smith-Pokorny eye response spectral curves.

25. The device of claim 22, wherein the standard spectral response curves are CIE standard observer curves.

26. The device of claim 22, wherein the least total error difference is determined with a least squares analysis.

27. The device of claim 22, wherein the first pixel comprises a first light pipe comprising the first nanowire and a first cladding surrounding the first nanowire and the second pixel comprises a second light pipe comprising the second nanowire and a second cladding surrounding the first nanowire.

28. The device of claim 27, wherein the first pixel further comprises a reflective surface surrounding the first light pipe and the second pixel further comprises a reflective surface surrounding the second light pipe.

29. The device of claim 27, wherein the first pixel comprises a first substrate and a first photodiode in the first substrate, the second pixel comprises a second substrate and a second photodiode in the second substrate.

* * * * *